(12) United States Patent
Coolbaugh et al.

(10) Patent No.: US 7,217,981 B2
(45) Date of Patent: May 15, 2007

(54) TUNABLE TEMPERATURE COEFFICIENT OF RESISTANCE RESISTORS AND METHOD OF FABRICATING SAME

(75) Inventors: Douglas D. Coolbaugh, Essex Junction, VT (US); Ebenezer E. Eshun, Essex Junction, VT (US); Richard J. Rassel, Colchester, VT (US); Robert M Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/905,473

(22) Filed: Jan. 6, 2005

(65) Prior Publication Data

US 2006/0145296 A1 Jul. 6, 2006

(51) Int. Cl.
*H01L 21/004* (2006.01)

(52) U.S. Cl. ............................. 257/380; 257/E21.004; 257/E21.006

(58) Field of Classification Search ................ 257/359, 257/379, 380
See application file for complete search history.

(56) References Cited

U.S. PATENT DOCUMENTS

| | | | |
|---|---|---|---|
| 4,454,495 A | 6/1984 | Werner et al. .............. 338/195 |
| 4,622,856 A * | 11/1986 | Binder et al. ................. 73/727 |
| 4,766,411 A | 8/1988 | Prieto et al. ................. 338/306 |
| 4,803,457 A | 2/1989 | Chapel, Jr. et al. ......... 338/195 |
| 4,907,341 A | 3/1990 | Chapel, Jr. et al. ........... 29/612 |
| 5,554,873 A * | 9/1996 | Erdeljac et al. ............. 257/380 |
| 5,585,776 A | 12/1996 | Anderson ................... 338/308 |
| 6,097,276 A | 8/2000 | Van Den Brock et al. ...... 338/9 |
| 6,306,718 B1 | 10/2001 | Singh et al. ................. 438/382 |
| 6,351,111 B1 | 2/2002 | Laraia ......................... 323/315 |
| 6,413,637 B2 | 7/2002 | Cipparrone et al. ........ 428/379 |
| 6,759,729 B1 * | 7/2004 | Racanelli et al. ........... 257/536 |
| 6,888,763 B1 * | 5/2005 | Guo ...................... 365/189.11 |
| 2002/0021126 A1 | 2/2002 | Ishibashi et al. ............ 324/251 |

FOREIGN PATENT DOCUMENTS

JP 02268462 A * 11/1990

* cited by examiner

*Primary Examiner*—Thomas L. Dickey
(74) *Attorney, Agent, or Firm*—Schmeiser, Olsen & Watts; Anthony Canale

(57) ABSTRACT

Tunable TCR resistors incorporated into integrated circuits and a method fabricating the tunable TCR resistors. The tunable TCR resistors including two or more resistors of two or more different materials having opposite polarity and different magnitude TCRs, the same polarity and different magnitude TCRs or having opposite polarity and about the same TCRs.

28 Claims, 13 Drawing Sheets

TUNABLE TEMPERATURE COEFFICIENT OF RESISTANCE RESISTORS AND METHOD OF FABRICATING SAME

FIELD OF THE INVENTION

The present invention relates to the field of integrated circuit resistors; more specifically, it relates integrated circuit resistors whose temperature coefficient of resistance may be tuned during the design and/or fabrication of the integrated circuit.

BACKGROUND OF THE INVENTION

The temperature of integrated circuits can influence the operation of integrated circuits, so temperature operating range must be taken into account during the design and fabrication of integrated circuits. Resistors are one element of integrated circuits that are affected by temperature. For example, current reference circuits use load resistors to control the current level. As the integrated circuit operating temperature changes so will the current. Often the temperature dependence of a resistor will adversely effect the performance of the integrated circuit in given portions of the temperature range of that the integrated circuit is expected to operate in. In other integrated circuits, a change in resistance over a temperature range may be desirable, but is difficult to control.

Therefore, there is a need for an integrated circuit resistor and a method of fabricating the resistor wherein the temperature dependency of resistance of the resistor can be tuned during design and/or fabrication of the integrated circuit containing the resistor.

SUMMARY OF THE INVENTION

A first aspect of the present invention is a structure, comprising: a first resistor comprising a first material, the first material having a first temperature coefficient of resistance, the first resistor in a first interlevel dielectric layer of an integrated circuit; and a second resistor comprising a second material, the second material having a second temperature coefficient of resistance, the second temperature coefficient of resistance different from the first temperature coefficient of resistance, the second resistor in the first interlevel dielectric layer of the integrated circuit or in a second interlevel dielectric layer of the integrated circuit, the first resistor and the second resistor electrically connected to each other and electrically coupled to a voltage source by wires formed in the first or the first and second dielectric layers, the wires having a lower resistance than either of the first and second resistors.

A second aspect of the present invention is a structure, comprising: a first resistor comprising a first silicon material, the first material having a first temperature coefficient of resistance; and a second resistor comprising a second silicon material, the second material having a second temperature coefficient of resistance, the second temperature coefficient of resistance different than the first temperature coefficient of resistance, the first resistor and the second resistor electrically connected to each other and electrically coupled in series or in parallel with respect to a voltage source.

A third aspect of the present invention is a method of fabricating a resistive element, comprising: providing a design temperature coefficient of resistance for the resistive element; selecting a first material having a first temperature coefficient of resistance and selecting a second material having a second temperature coefficient of resistance; the second temperature coefficient of resistance different from the first temperature coefficient of resistance; forming a first resistor of the resistive element from the first material; forming a second resistor of the resistive element from the second material; electrically connecting the first resistor and the second resistor to each other; electrically coupling the first resistor and the second resistor to a voltage source; and selecting the first and the second temperature coefficients of resistance such that a temperature coefficient of resistance of the resistive element matches the design temperature coefficient of resistance.

A fourth aspect of the present invention is a method of fabricating a resistive element, comprising: providing a design temperature coefficient of resistance for the resistive element; selecting a first silicon material having a first temperature coefficient of resistance and selecting a second silicon material having a second temperature coefficient of resistance; the second temperature coefficient of resistance different from the first temperature coefficient of resistance; forming a first resistor of the resistive element from the first material; forming a second resistor of the resistive from the second material; electrically connecting the first resistor and the second resistor to each other; electrically coupling the first resistor and the second resistor to a voltage source; and selecting the first and the second temperature coefficients of resistance such that a temperature coefficient of resistance of the resistive element matches the design temperature coefficient of resistance.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
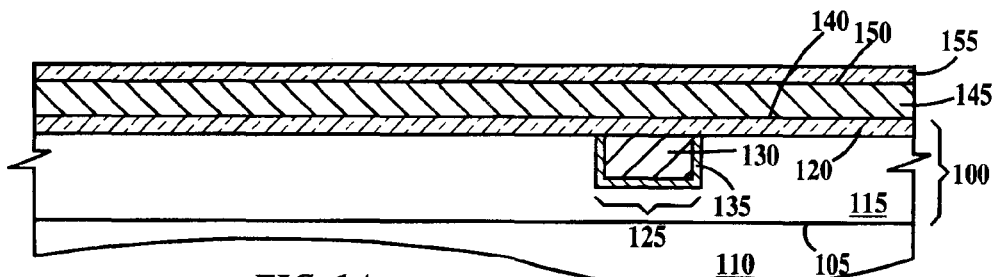
FIGS. 1A through 1F are partial cross-sectional views illustrating fabrication of a tunable TCR resistor according to a first embodiment of the present invention.

The resistance of a resistor at a given temperature is defined by equation (1):

$$R = R_{REF}[1 + \alpha(T - T_{REF})] \quad (1)$$

where:

R=the resistance of the resistor in ohms at temperature T in °C., $R_{REF}$=the resistance of the resistor in ohms at a reference temperature $T_{REF}$, in °C., usually 20° C., α=the temperature coefficient of resistance (TCR) in 1/°C. of the material comprising the resistor (tables of TCR are often in ppm/°C.), T=operating temperature of the resistor in °C., and $T_{REF}$=a specified reference temperature in °C. for the α of the resistor material.

The TCR of some materials is positive, that is resistance increases with increasing temperature. The TCR of some materials is negative, that is resistance decreases with increasing temperature. The reference resistance $R_{REF}$ of a given resistor, is a function of the width, length, thickness and resistivity of the material of the resistor, while the resistivity itself is a physical property of the resistor material.

The $R_{REF}$ can be selected during design by selection of photomask dimensions or during fabrication by selection of materials or process adjustments to change the resistivity of the material of the resistor. Ion implantation of impurity species is one method of changing the resistivity of a material. The TCR of a resistor can be selected during design by selection of materials or during fabrication by selection of materials or process adjustments to change the TCR of the material of the resistor. Ion implantation of impurity species is one method of changing the TCR of a material.

In the example case of two resistors in series, the resistance of the series combination is given by equation (2):

$$R_{SERIES} = \{R1_{REF}[1+\alpha1(T-T_{REF})]\} + \{R2_{REF}[1+\alpha2(T-T_{REF})]\} \quad (2)$$

where:

$R_{SERIES}$=the resistance of resistors R1 and R2, $R1_{REF}$=the resistance of the R1 resistor in ohms at temperature $T_{REF}$, in °C., $R2_{REF}$=the resistance of the R2 resistor in ohms at temperature $T_{REF}$, in °C., α1=the TCR of the R1 resistor in 1/°C., and α2=the TCR of the R2 resistor in 1/°C.

It is most readily seen in the example when $R1_{REF}$ equals $R2_{REF}$ that the effective TCR of $R_{SERIES}$=R1+R2 is α1+α2. When $R1_{REF}$ is not equal to $R2_{REF}$, then the effective TCR of R1+R2 is a function of $R1_{REF}$, $R2_{REF}$, α1 and α2. In the present invention TCRs of different resistors of a set of two (or more) electrically interconnected resistors may be selected to have all negative TCRs, all positive TCRs, some negative and some positive TCRs. The absolute magnitudes of the TCRs may be the same or different. In the case where two resistors are wired in series having TCRs of about equal magnitude but opposite polarity, the resultant combined resistor will have a TCR of zero or about zero. Wiring two (or more) resistors having opposite polarity TCRs (a resistor with a positive TCR with a resistor with a negative TCR allows a smaller overall TCR of the combined resistor comprising the two (or more) individual resistors and thus the resistance of the combined resistors will not change as much with temperature.

Similar equations for parallel resistors and complex combinations of resistors may be developed as well. It should be remembered that both the effective reference resistance and the effective TCR of a multiple-resistor combination can be tuned. In order to make use of the tuning of TCR or resistance two or more resistors having different TCRs must be fabricated as is discussed infra.

The present invention will be described using damascene and dual damascene wiring technology. Damascene and dual damascene wiring technology is often practiced with aluminum, aluminum alloy and copper metallurgies. However, the invention may be practiced using sub-etch wiring technology. Sub-etch technology is often practiced with Al and Al alloy metallurgies.

A damascene process is one in which wire trench or via openings are formed in an interlevel dielectric layer (ILD) of an integrated circuit, an electrical conductor deposited on a top surface of the dielectric of sufficient thickness to fill the trenches and a chemical-mechanical-polish (CMP) process performed to remove excess conductor and make the surface of the conductor co-planer with the surface of the ILD layer to form damascene wires (or damascene vias).

A dual damascene process is one in which via openings are formed through the entire thickness of an ILD followed by formation of trenches part of the way through the dielectric layer in any given cross-sectional view. All via openings are intersected by integral wire trenches above and by a wire trench below, but not all trenches need intersect a via opening. An electrical conductor is deposited on a top surface of the dielectric of sufficient thickness to fill the trenches and via opening and a CMP process performed to make the surface of the conductor in the trench co-planer with the surface the ILD layer to form dual damascene wire and dual damascene wires having integral dual damascene vias.

The damascene and dual damascene wires so-formed are used to wire active or passive devices formed in the substrate or within the ILD layer into integrated circuits.

A sub-etch process is one in which a conductive layer is deposited on top of the ILD containing vias (or contacts in the case of the first wiring layer) a photoresist layer is formed on the conductive layer, the photoresist layer is patterned, the conductive layer etched and the patterned photoresist removed to form sub-etched wires. Vias for a subetch process are formed in the ILD in a manner similar to that for a damascene via as described supra. The sub-etched wires so-formed are used to wire active or passive devices formed in the substrate or within the ILD layer into integrated circuits A tunable TCR resistor is a resistor whose TCR can be predetermined by selection of the materials during design or fabrication of the resistor.

FIGS. 1A through 1F are partial cross-sectional views illustrating fabrication of a tunable TCR resistor according to a first embodiment of the present invention. In FIG. 1A, an exemplary interlevel dielectric layer (ILD) 100 is formed on a top surface 105 of a substrate or a lower ILD layer 110, hereafter ILD layer 110. ILD layer 100 includes a lower dielectric layer 115 and an optional upper dielectric layer 120. Formed in ILD layer 100 is an exemplary damascene wire 125. Damascene wire 125 is formed from a core conductor 130 and an optional conductive liner 135. Formed on a top surface 140 of ILD layer 100 (which is also the top surface of upper ILD layer 120) is a first resistive layer 145. Formed on a top surface 150 of first resistive layer 145 is an optional etch stop layer 155.

In one example, lower dielectric layer 115 comprises $SiO_2$ or a low K dielectric, upper dielectric layer 120 comprises $Si_3N_4$ or a layer of $SiO_2$ on top of a layer of $Si_3N_4$, core conductor 130 comprises Al, AlCu, AlCuSi or Cu, conductive liner 135 comprises Ta, TaN, Ti, TiN or combinations thereof and etch stop layer 155 comprises $Si_3N_4$.

Figure 1B:
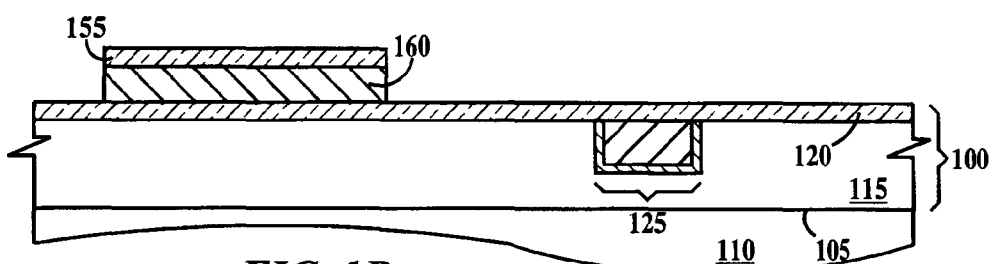

In FIG. 1B, a photolithographic process comprising forming a photoresist layer on optional etch stop layer 155, patterning the photoresist layer, etching etch stop layer 155 (if present), etching first resistive layer 145 (see FIG. 1A)

and removing the patterned photoresist layer is performed to form a first resistor 160. Etch stop layer 155 is required, for example, if the etch processes used to form interconnections in a subsequent ILD layer (see FIG. 1C) would aggressively etch first resistor 160. First resistor 160 has a first TCR. First resistor 160 may be chosen to have a TCR in the range of about −400 ppm/°C. to about 400 ppm/°C. Material for first resistor 160 may be selected from, but is not limited to, any of the materials listed in Table I infra.

Figure 1C:
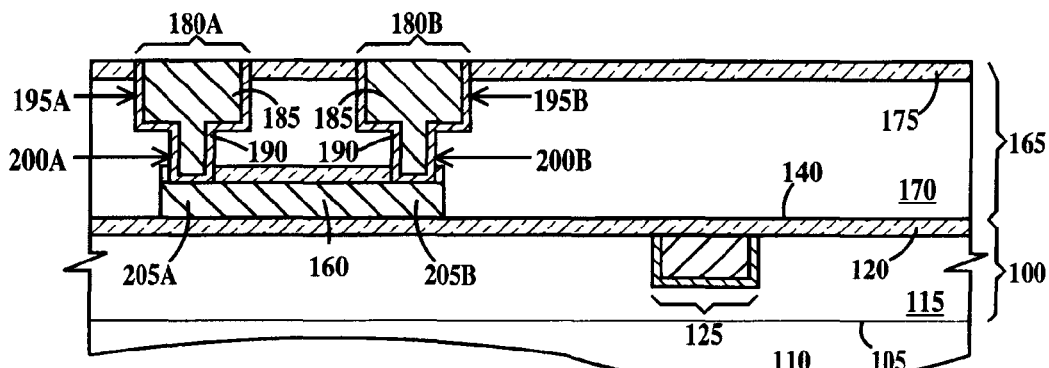

In FIG. 1C, an exemplary ILD layer 165 is formed on top surface 140 of ILD layer 100. ILD layer 165 includes a lower dielectric layer 170 and an optional upper dielectric layer 175. Formed in ILD layer 165 are exemplary dual damascene wires 180A and 180B. Each dual damascene wire 180A and 180B is formed from a core conductor 185 and an optional conductive liner 190. Dual damascene wire 180A includes a wire portion 195A and an integral via portion 200A. Dual damascene wire 180B includes a wire portion 195B and an integral via portion 200B. Via portions 200A and 200B of respective dual damascene wires 180A and 180B contact opposite ends 205A and 205B respectively of first resistor 160.

In one example, lower dielectric layer 170 comprises $SiO_2$ or a low K dielectric, upper dielectric layer 175 comprises $Si_3N_4$ or a layer of $SiO_2$ on top of a layer of $Si_3N_4$, core conductor 185 comprises Al, AlCu, AlCuSi or Cu and conductive liner 190 comprises Ta, TaN, Ti, TiN or combinations thereof.

Figure 1D:
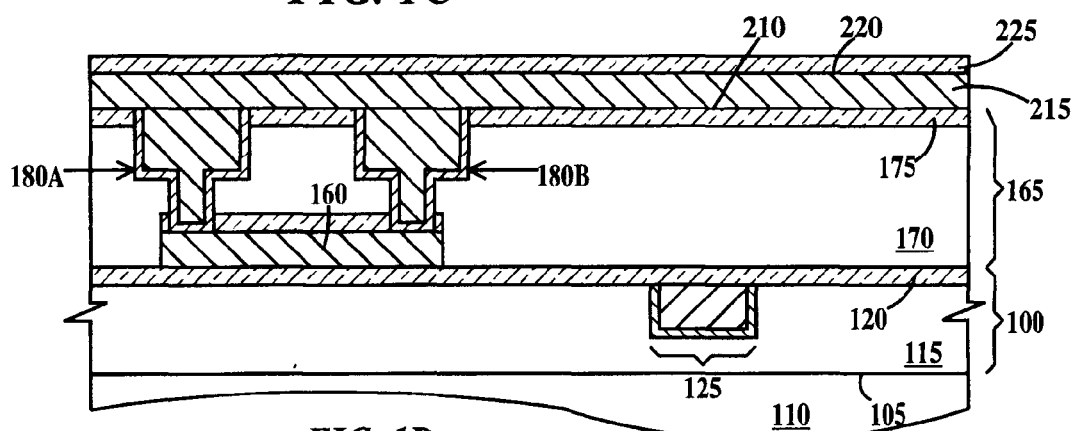

In FIG. 1D, formed on a top surface 210 of ILD layer 165 (which is also the top surface of upper ILD layer 175) is a second resistive layer 215. Formed on a top surface 220 of second resistive layer 215 is an optional etch stop layer 225. In one example, etch stop layer 225 comprises $Si_3N_4$.

Figure 1E:
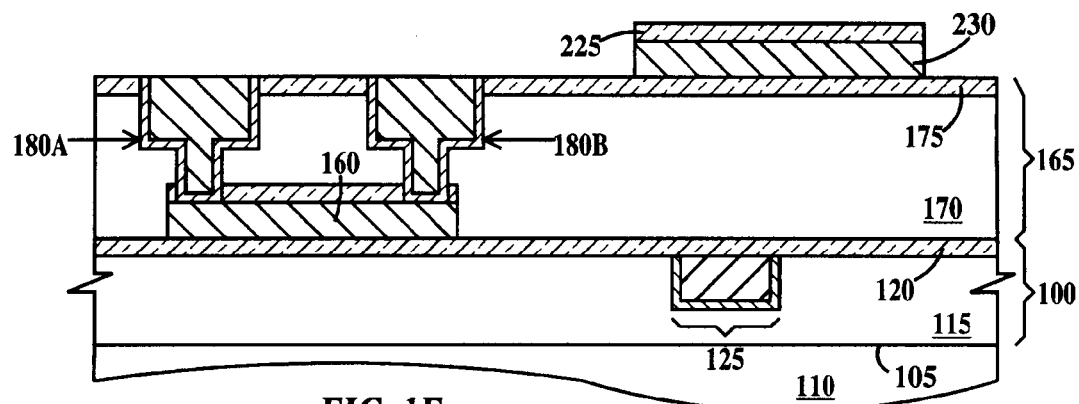

In FIG. 1E, a photolithographic process comprising forming a photoresist layer on optional etch stop layer 225, patterning the photoresist layer, etching etch stop layer 225 (if present), etching second resistive layer 215 (see FIG. 1D) and removing the patterned photoresist layer is performed to form a second resistor 230. Etch stop layer 225 is required, for example, if the etch processes used to form interconnections in a subsequent ILD (see FIG. 1F) would aggressively etch second resistor 230. Second resistor 230 has a second TCR. In one example second resistor 230 is about 30 to about 70 nm thick. Second resistor 230 may be chosen to have a TCR in the range of about −400 ppm/°C. to about 400 ppm/°C., but not the same TCR as the TCR for first resistor 160. Material for second resistor 230 may be selected from, but is not limited to, any of the materials listed in Table I infra, but not the identical material as first resistor 160.

Figure 1F:
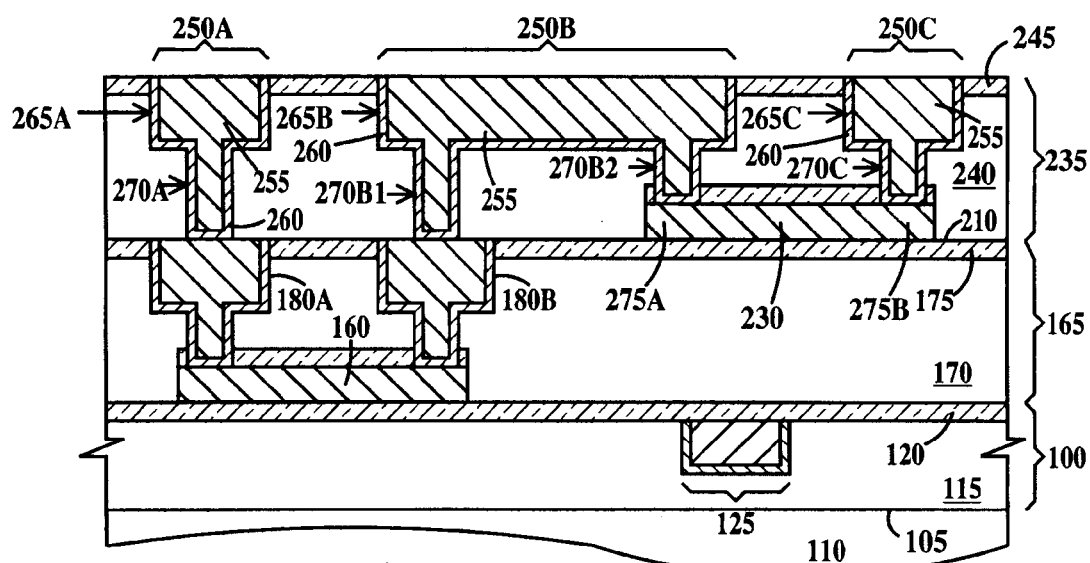

In FIG. 1F, an exemplary ILD layer 235 is formed on top surface 210 of ILD layer 165. ILD layer 235 includes a lower dielectric layer 240 and an optional upper dielectric layer 245. Formed in ILD layer 235 are exemplary dual damascene wires 250A, 250B and 250C. Each dual-damascene wire 250A, 250B and 250C is formed from a core conductor 255 and an optional conductive liner 260. Dual damascene wire 250A includes a wire portion 265A and an integral via portion 270A. Dual damascene wire 250B includes a wire portion 265B and an integral via portions 270B1 and 270B2. Dual damascene wire 250C includes a wire portion 265C and an integral via portion 270C. Via portion 270A of dual damascene wire 250A contacts dual damascene wire 180A. Via portion 270B1 of dual damascene wire 250B contacts dual damascene wire 180B and via portion 270B2 of dual damascene wire 250B contacts a first end 275A of second resistor 230. Via portion 270C of dual damascene wire 250C contacts dual damascene wire 180B and via portion 270B2 of dual damascene wire 250B contacts a first end 275A of second resistor 230.

In one example, lower dielectric layer 240 comprises $SiO_2$ or a low K dielectric, upper dielectric layer 245 comprises $Si_3N_4$, core conductor 255 comprises Al, AlCu, AlCuSi or Cu and conductive liner 260 comprises Ta, TaN, Ti, TiN or combinations thereof.

Wires 180A, 180B, 250A, 250B and 250C have a different TCR than resistors 160 and 170. Wires 180A, 180B, 250A, 250B and 250C have a significantly lower resistance than resistors 160 and 170. In one example the resistance of wires 180A, 180B, 250A, 250B and 250C is about 3 orders of magnitudes lower than the combined resistance of resistors 160 and 170.

While resistors 160 and 230 are illustrated as being wired in series in FIG. 1F with respect to a voltage source coupled between wires 250A and 250C, one of ordinary skill in the art would be able to design an interconnection scheme to wire resistors 160 and 230 in parallel.

TABLE I

| Material | Sheet Rho ohms/square Range | TCR ppm/° C. Range |
| --- | --- | --- |
| CrNi | 10 to 400 | 100 to 200 |
| CrSi | 100 to 4000 | −200 to 200 |
| CrTi | 250 to 600 | −150 to 150 |
| CrSiO | up to 600 | −50 to 200 |
| $SnO_2$ | up to 104 | about 100 |
| W or Mo or Re | 10 to 500 | −20 to −100 |
| Ta | up to 100 | −100 to 100 |
| $Ta_2N$ | 10 to 100 | about −85 |
| NiCr (80:50) | | about −85 |
| NiCrAlFe (75:20:3:2) | | about 20 |
| NiCrAlFe (76:20:2:2) | | about 5 |
| Ru | 250–300 | about 0 |
| Ru | about 10,000 | about −400 |
| Polysilicon | | |

Figure 2A:
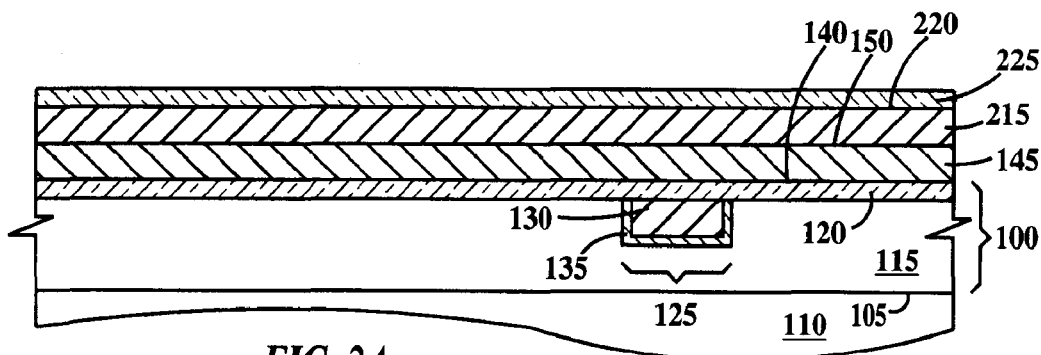
FIGS. 2A through 2E are partial cross-sectional views illustrating fabrication of a tunable TCR resistor according to a second embodiment of the present invention.

FIGS. 2A through 2E are partial cross-sectional views illustrating fabrication of a tunable TCR resistor according to a second embodiment of the present invention. In FIG. 2A, ILD 100 is formed on top surface 105 of substrate 110. ILD layer 100 includes lower dielectric layer 115 and optional upper dielectric layer 120. Formed in ILD layer 100 is Damascene wire 125. Damascene wire 125 is formed from a core conductor 130 and optional conductive liner 135. Formed on top surface 140 of ILD layer 100 (which is also the top surface of upper ILD layer 120) is first resistive layer 145. Formed on a top surface 150 of first resistive layer 145 is second resistive layer 215. Formed on top surface 220 of second resistive layer 215 is optional etch stop layer 225. Etch stop layer 225 is required, for example, if the etch processes used to form interconnections in a subsequent ILD layer (see FIG. 2E) would aggressively etch the material of second resistive layer 215. Materials for lower dielectric layer 115, upper dielectric layer 120, core conductor 130, conductive liner 135, and etch stop layer 255 have been described supra.

Figure 2B:
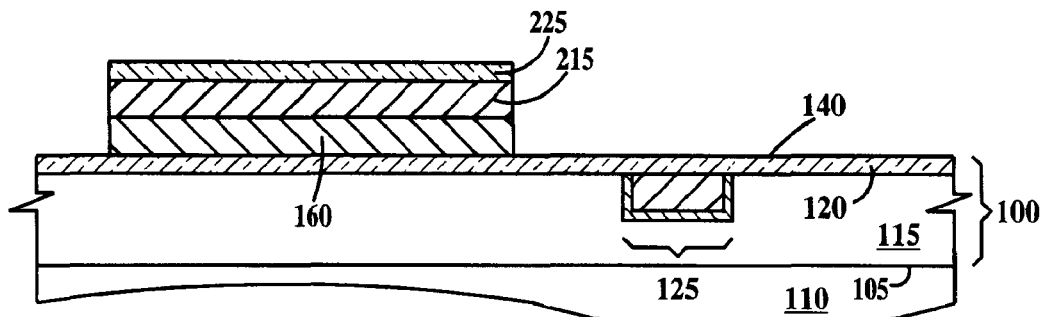

In FIG. 2B, a photolithographic process comprising forming a photoresist layer on etch stop layer 225, patterning the photoresist layer, etching etch stop layer 225 (if present), etching first resistive layer 145 and second resistive layer 215 (see FIG. 2A) and removing the patterned photoresist layer is performed to form first resistor 160 covered by a portion of first resistive layer 215. The thickness, materials and TCR of first resistor 160 have been described supra and in Table I.

Figure 2C:
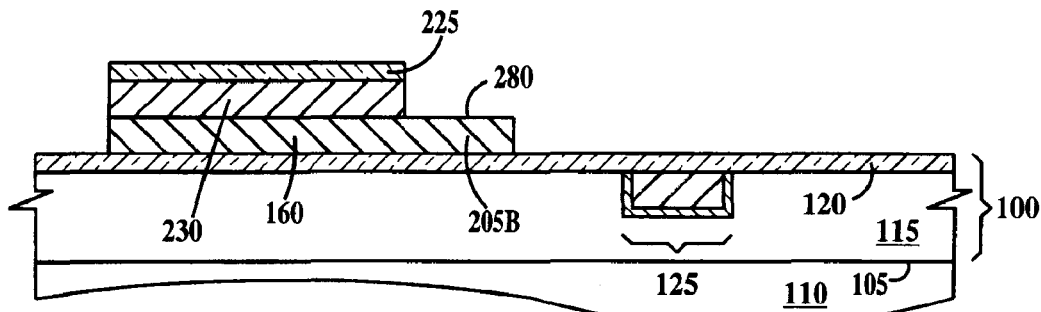

In FIG. 2C, a photolithographic process comprising forming a photoresist layer on exposed upper dielectric layer 215, damascene wire 125 and remaining etch stop layer 225, patterning the photoresist layer, etching etch stop layer 225 (if present), etching a portion of remaining second resistive layer 215 (see FIG. 2B) is performed thus forming second resistor 230 and exposing a top surface 280 of first resistor 160 at second end 205B of first resistor 160. The patterned photoresist layer then removed. Second resistor 230 is covered by a portion of etch stop layer 225. The thickness, materials and TCR of second resistor 230 have been described supra and in Table I.

Figure 2D:
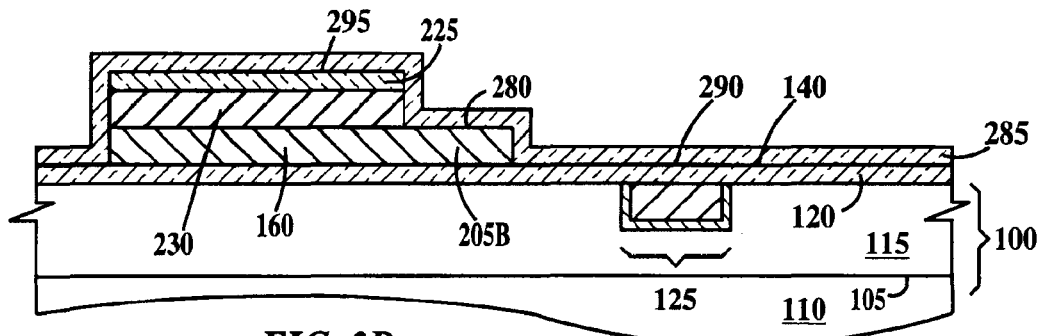

In FIG. 2D, an optional etch stop layer 285 (which may also function as a diffusion barrier) is formed over exposed top surface 140 of upper dielectric layer 120, a top surface 290 of damascene wire 125, exposed top surface 280 of first resistor 160 and a top surface 295 of etch stop layer 225. Etch stop layer 285 is required, for example, if the etch processes used to form interconnections in a subsequent ILD layer (see FIG. 2E) would aggressively etch the material of first resistor 160 or to stop diffusion into or out of first and second resistors 160 and 230. In one example, etch stop layer 285 comprises $Si_3N_4$.

Figure 2E:
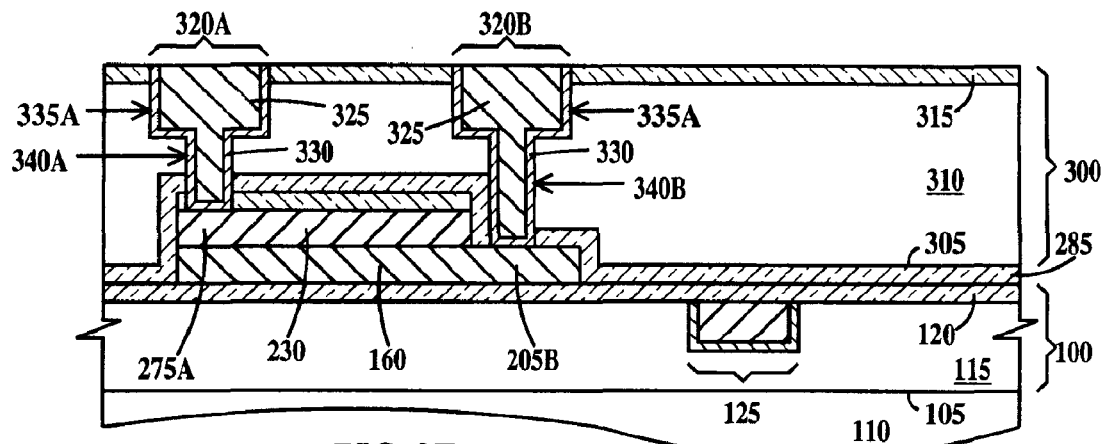

In FIG. 2E, an exemplary ILD layer 300 is formed on top surface 305 of etch stop layer 285. ILD layer 300 includes a lower dielectric layer 310 and an optional upper dielectric layer 315. Formed in ILD layer 300 are exemplary dual damascene wires 320A and 320B. Each dual damascene wire 320A and 320B is formed from a core conductor 325 and an optional conductive liner 330. Dual damascene wire 320A includes a wire portion 335A and an integral via portion 340A. Dual damascene wire 320B includes a wire portion 335B and an integral via portion 340B. Via portion 340A of dual damascene wire 320A contacts first end 275A of second resistor 230. Via portion 340B of dual damascene wire 320B second end 205B of first resistor 160. Resistors 160 and 230 are wired in a complex series/parallel combination with respect to a voltage source coupled between wires 320A and 320B.

In one example, lower dielectric layer 310 comprises $SiO_2$ or a low K dielectric, upper dielectric layer 315 comprises $Si_3N_4$, core conductor 325 comprises Al, AlCu, AlCuSi or Cu and conductive liner 330 comprises Ta, TaN, Ti, TiN or combinations thereof.

Wires 320A and 320B have a different TCR than resistors 160 and 170. Wires 320A and 320B have a significantly lower resistance than resistors 160 and 170. In one example the resistance of wires 320A and 320B is about 3 orders of magnitude lower than the combined resistance of resistors 160 and 170.

Figure 3A:
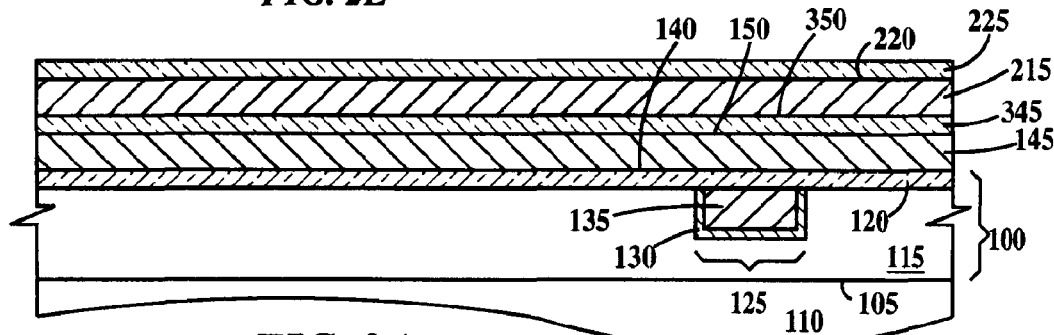
FIGS. 3A through 3F are partial cross-sectional views illustrating fabrication of a tunable TCR resistor according to a third embodiment of the present invention.

FIGS. 3A through 3F are partial cross-sectional views illustrating fabrication of a tunable TCR resistor according to a third embodiment of the present invention. In FIG. 3A, ILD 100 is formed on top surface 105 of substrate 110. ILD layer 100 includes lower dielectric layer 115 and optional upper dielectric layer 120. Formed in ILD layer 100 is Damascene wire 125. Damascene wire 125 is formed from core conductor 130 and optional conductive liner 135. Formed on top surface 140 of ILD layer 100 (which is also the top surface of upper ILD layer 120) is first resistive layer 145. Formed on a top surface 150 of first resistive layer 145 is an insulating layer 345. Formed on a top surface 350 of insulating layer 345 is second resistive layer 215. Formed on top surface 220 of second resistive layer 215 is optional etch stop layer 225. Etch stop layer 225 is required, for example, if the etch processes used to form interconnections in a subsequent ILD layer (see FIG. 3E) would aggressively etch the material of second resistive layer 215. Materials for lower dielectric layer 115, upper dielectric layer 120, core conductor 130, conductive liner 135, and etch stop layer 255 have been described supra. In One example, insulating layer 345 comprises $Si_3N_4$.

Figure 3B:
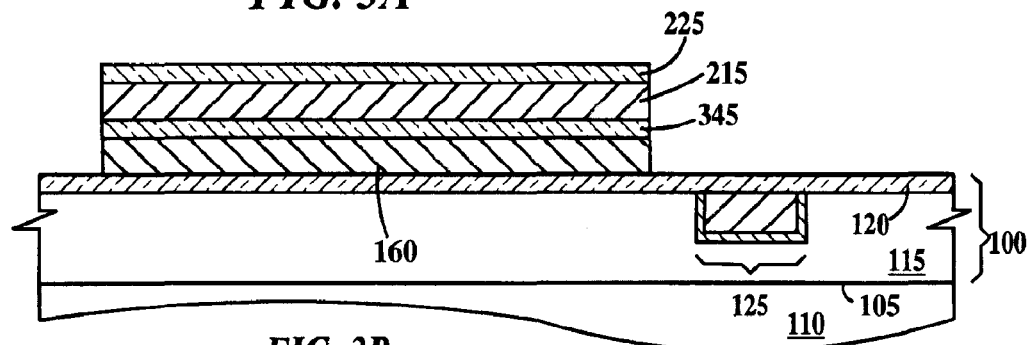

In FIG. 3B, a photolithographic process comprising forming a photoresist layer on etch stop layer 225, patterning the photoresist layer, etching etch stop layer 225 (if present), etching first resistive layer 145 (see FIG. 3A), etching insulating layer 345, etching second resistive layer 215 and removing the patterned photoresist layer is performed to form first resistor 160 covered by a portion of insulating layer 345. The thickness, materials and TCR of first resistor 160 have been described supra and in Table I.

Figure 3C:
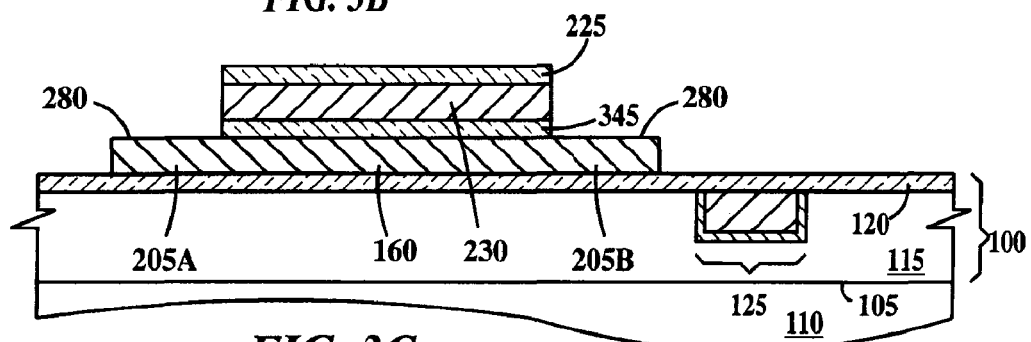

In FIG. 3C, a photolithographic process comprising forming a photoresist layer on exposed upper dielectric layer 215, exposed damascene wire 125 and remaining etch stop layer 225, patterning the photoresist layer, etching etch stop layer 225 (if present), etching a portion of remaining second resistive layer 215 (see FIG. 2B) is performed to form second resistor 230 followed by etching a portion of remaining insulating layer 345 to expose top surface 280 of first resistor 160 on opposite ends 205A and 205B of first resistor 160. The patterned photoresist layer is then removed. Second resistor 230 is covered by a portion of etch stop layer 225. The thickness, materials and TCR of second resistor 230 have been described supra and in Table I.

Figure 3D:
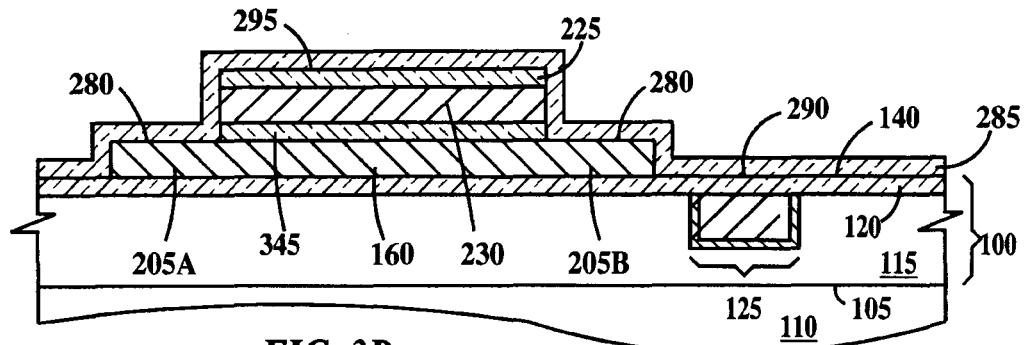

In FIG. 3D, etch stop layer 285 is formed over exposed top surface 140 of upper dielectric layer 120, top surface 290 of damascene wire 125, exposed top surface 280 of first resistor 160 and a top surface 295 of etch stop layer 225. Etch stop layer 285 is required, for example, if the etch processes used to form interconnections in a subsequent ILD layer (see FIGS. 3E and 3F) would aggressively etch the material of first resistor 160 or to stop diffusion into or out of first and second resistors 160 and 230. The material of etch stop layer 285 has been described supra.

Figure 3E:
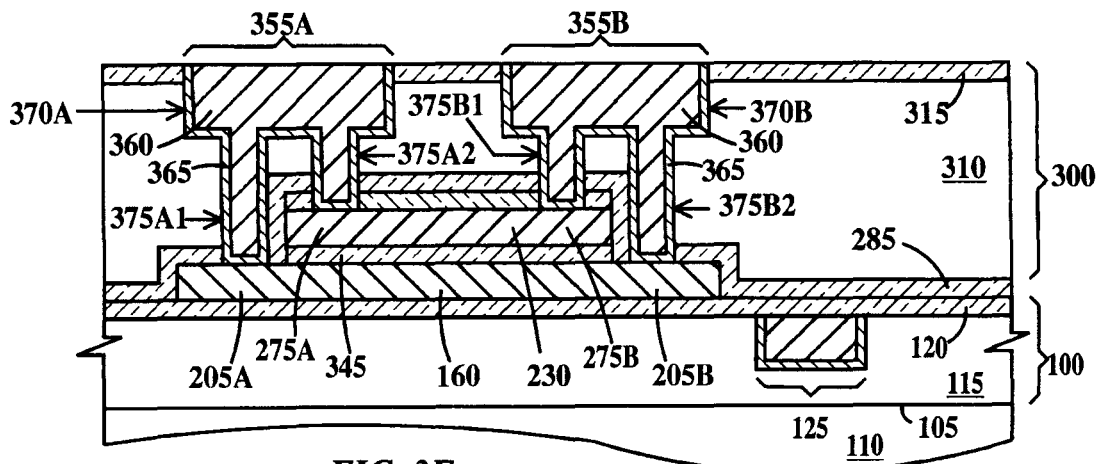

In FIG. 3E first resistor 160 and second resistor 230 are wired in parallel with respect to a voltage source coupled between wires 355A and 355B. In FIG. 3E, ILD layer 300 is formed on top surface 305 of etch stop layer 285. ILD layer 300 includes lower dielectric layer 310 and optional upper dielectric layer 315. Formed in ILD layer 235 are exemplary dual damascene wires 355A and 355B. Each dual damascene wire 355A and 355B is formed from a core conductor 360 and an optional conductive liner 365. Dual damascene wire 355A includes a wire portion 370A and an integral via portions 375A1 and 375A2. Dual damascene wire 355B includes a wire portion 370B and integral via portions 375B1 and 375B2. Via portion 375A1 of dual damascene wire 355A contacts first end 205A of first resistor 160. Via portion 375A2 of dual damascene wire 355A contacts first end 275A of second resistor 230. Via portion 375B1 of dual damascene wire 355B contacts second end 205B of first resistor 160. Via portion 375B2 of dual damascene wire 355B contacts second end 275B of second resistor 230. Materials for lower dielectric layer 310, upper dielectric layer 315 have been described supra.

In one example, core conductor 360 comprises Al, AlCu, AlCuSi or Cu and conductive liner 365 comprises Ta, TaN, Ti, TiN or combinations thereof.

Wires 355A and 355B have a different TCR than resistors 160 and 170. Wires 355A and 355B have a significantly lower resistance than resistors 160 and 170. In one example the resistance of wires 355A and 355B is about 3 orders of magnitude lower than the combined resistance of resistors 160 and 170.

Figure 3F:
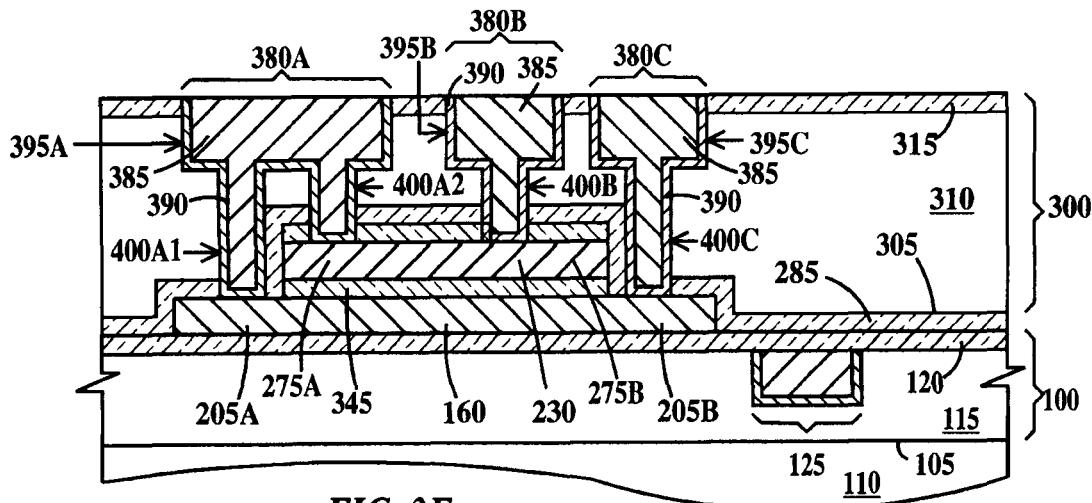

FIG. 3F is similar to FIG. 3E except resistors 160 and 230 are wired in series with respect to a voltage source coupled between wires 380B and 380C. In FIG. 3F first resistor 160 and second resistor 230 are wired in parallel. In FIG. 3F, ILD layer 300 is formed on top surface 305 of etch stop layer 285 165. ILD layer 300 includes a lower dielectric layer 310 and an optional upper dielectric layer 315. Formed in ILD layer 235 are exemplary dual damascene wires 380A, 380B and 380C. Each dual damascene wire 380A, 380B and 380C is formed from a core conductor 385 and an optional conductive liner 390. Dual damascene wire 380A includes a wire portion 395A and an integral via portions 400A1 and 400A2. Dual damascene wire 380B includes a wire portion 395B and an integral via portion 400B. Dual damascene wire 380C includes a wire portion 395B and an integral via portion 400C. Via portion 400A1 of dual damascene wire 380A contacts first end 205A of first resistor 160. Via portion 400A2 of dual damascene wire 380A contacts first end 275A of second resistor 230. Via portion 400B of dual damascene wire 380B contacts second end 275B of second resistor 230. Via portion 400C of dual damascene wire 380C contacts second end 205B of first resistor 160.

Materials for lower dielectric layer 310, upper dielectric layer 315 comprises $Si_3N_4$ have been described supra. In one example, core conductor 385 comprises Al, AlCu, AlCuSi or Cu and conductive liner 390 comprises Ta, TaN, Ti, TiN or combinations thereof.

Wires 380A, 380B and 380C have a different TCR than resistors 160 and 170. Wires 380A, 380B and 380C have a significantly lower resistance than resistors 160 and 170. In one example the resistance of wires 380A, 380B and 380C is about 3 orders of magnitude lower than the combined resistance of resistors 160 and 170.

Figure 4A:
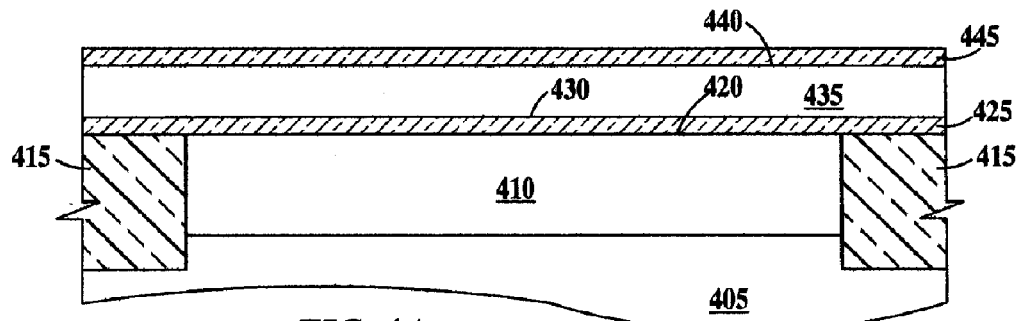
FIGS. 4A through 4H are partial cross-sectional views illustrating fabrication of a tunable TCR resistor according to a fourth embodiment of the present invention.

FIGS. 4A through 4H are partial cross-sectional views illustrating fabrication of a tunable TCR resistor according to a fourth embodiment of the present invention. In FIG. 4A, formed in a single-crystal (or bulk) silicon substrate 405 is a doped single-crystal silicon resistor 410 (hereoafter diffused resistor 410) bordered by shallow trench isolation 415. Formed on a top surface 420 of substrate 405 is a dielectric layer 425. In one example, dielectric layer 425 is the same layer used as a gate dielectric and polysilicon layer 435 is the same layer used to form gates for N-channel field effect transistors (NFETs) and P-channel field effect transistors (PFETs) formed in/on substrate 405 as part of an integrated circuit incorporating the TCR tunable resistors of the present invention. Formed on a top surface 430 of dielectric layer 425 is a polysilicon layer 435. Formed on a top surface 440 of polysilicon layer 435 is an insulating layer 445. Diffused resistor 410 is doped N-type or P-type. Diffused resistor 410 may be formed by ion-implantation of arsenic (As), phosphorus (P) or antimony (Sb), boron (B), fluorinated boron ($BF_2$), indium (In) or combinations thereof into substrate 405 or by doped epitaxial deposition. Diffused resistor 410 has a first TCR. Diffused resistor 410 may be chosen to have a TCR in the range of about −1000 ppm/°C. to about 10,000 ppm/°C. TCR of resistor 410 is not only a function of dopant species and dopant concentration but is also a function of the thermal cycles resistor 410 has undergone after ion implantation of the dopant species. Material for diffused resistor 410 may be selected from, but is not limited to, any of the materials listed in Table II infra as well as Sb, In and $BF_2$.

TABLE II

| Silicon Dopant Species | Concentration Range atm/cm$_3$ | TCR Range ppm/° C. |
|---|---|---|
| As | $10^{17}$ to $10^{21}$ | −1000 to 3000 |
| P | $10^{17}$ to $10^{21}$ | −1000 to 3000 |
| B | $10^{17}$ to $10^{21}$ | −1000 to 3000 |
| Sb | $10^{17}$ to $10^{21}$ | −1000 to 10000 |

Concentration range in TABLE II refers to the peak concentration of the dopant species in cases where the dopant species is not uniformly distributed throughout resistor 410. For example, diffused resistors with ion/implanted dopant species may have peak concentration distributions, the peak located at top surface 420 or within diffused resistor 410, while diffused resistors doped during epitaxial deposition of a doped epitaxial layer that becomes the diffused resistor after and STI process may have relatively uniform dopant concentration distributions from top surface 420 toward substrate 405. In one example, dielectric layer 425 comprises $SiO_2$ and insulating layer 445 comprises $SiO_2$, $Si_3N_4$ or combinations thereof.

Figure 4B:
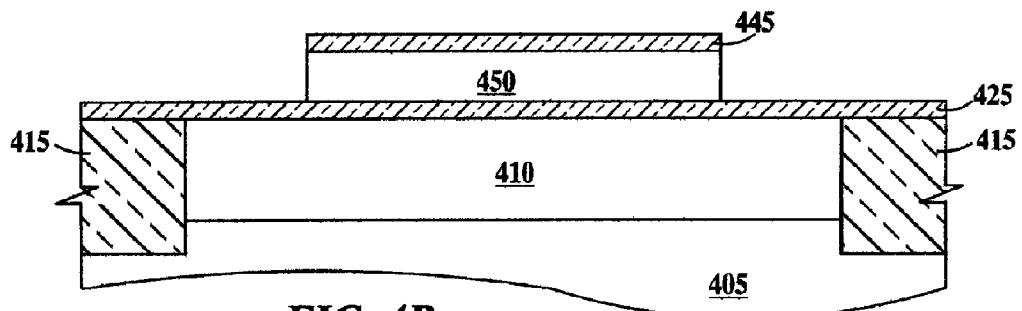

In FIG. 4B, a photolithographic process comprising forming a photoresist layer on insulating layer 445, patterning the photoresist layer, etching insulating layer 445, etching polysilicon layer 435 (see FIG. 4A), and removing the patterned photoresist layer is performed to form a polysilicon resistor 450. Polysilicon resistor 450 may be doped by ion-implantation of As, P, Sb, B, $BF_2$, In or combinations thereof before or after formation of resistor 450 or after formation of spacers 455. Polysilicon resistor 450 has a second TCR. In one example polysilicon resistor 450 is about 50 to about 400 nm thick. Polysilicon resistor 450 may be chosen to have a TCR in the range of about 2000 ppm/°C. to about −4000 ppm/°C., but not the same TCR value as the TCR value for diffused resistor 410. TCR of resistor 450 is not only a function of dopant species and dopant concentration but is also a function of the thermal cycles resistor 450 has undergone after ion implantation of the dopant species as well as the polysilicon grain size. Material for polysilicon resistor 450 may be selected from, but is not limited to, any of the materials listed in Table III infra as well as Sb, In and $BF_2$.

TABLE III

| Dopant Species | Concentration Range atm/cm$_3$ | TCR Range ppm/° C. |
|---|---|---|
| As | $10^{17}$ to $10^{21}$ | −4000 to 3000 |
| P | $10^{17}$ to $10^{21}$ | −4000 to 3000 |
| B | $10^{17}$ to $10^{21}$ | −4000 to 3000 |

Concentration range in TABLE III refers to the peak concentration of the dopant species in cases where the dopant species is not uniformly distributed throughout polysilicon resistor 450. For example, polysilicon resistors with ion/implanted dopant species may have peak concentration distributions while polysilicon resistors doped during deposition of the polysilicon may have relatively uniform dopant concentration distributions.

Figure 4C:
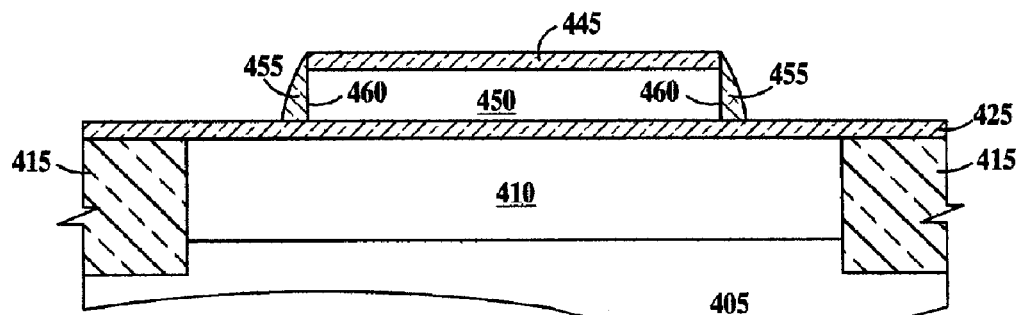

In FIG. 4C, optional spacers 455 are formed on sidewalls 460 of polysilicon resistor 450. Spacers 445 are formed by blanket depositions of an insulating layer, followed by a directional reactive ion etch (RIE) process. The spacer process may be repeated multiple times so spacers 445 include multiple layers. In one example, spacers 445 comprise SiO$_2$, Si$_3$N$_4$ or combinations thereof.

Figure 4D:
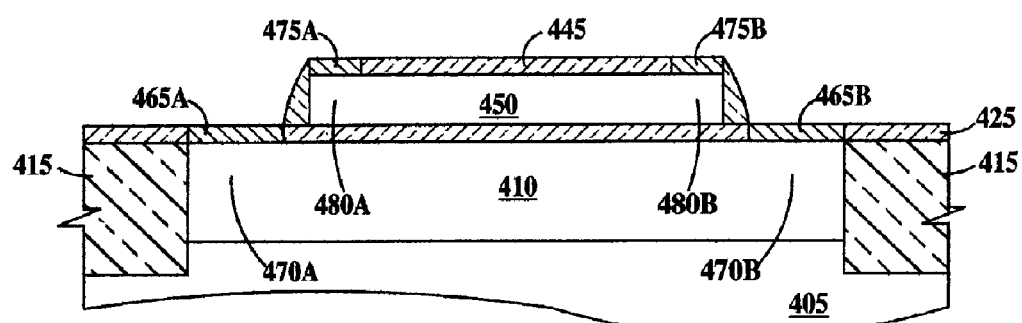

In FIG. 4D, silicide contacts 465A and 465B on respective opposite ends 470A and 470B of diffused resistor 410 are formed. Also silicide contacts 475A and 475B on respective opposite ends 480A and 480B of polysilicon resistor 450 are formed. Silicide contacts 465A, 465B, 475A and 475B are formed by etching openings in dielectric layer 425 and insulating layer 445, depositing a layer of a metal such as Pt or Co, annealing the substrate so the metal reacts with silicon to for a metal silicide, and etching away unreacted metal.

FIGS. 4E, 4F, 4G and 4H illustrate alternative methods of interconnecting diffused resistor 410 and polysilicon resistor 450.

Figure 4E:
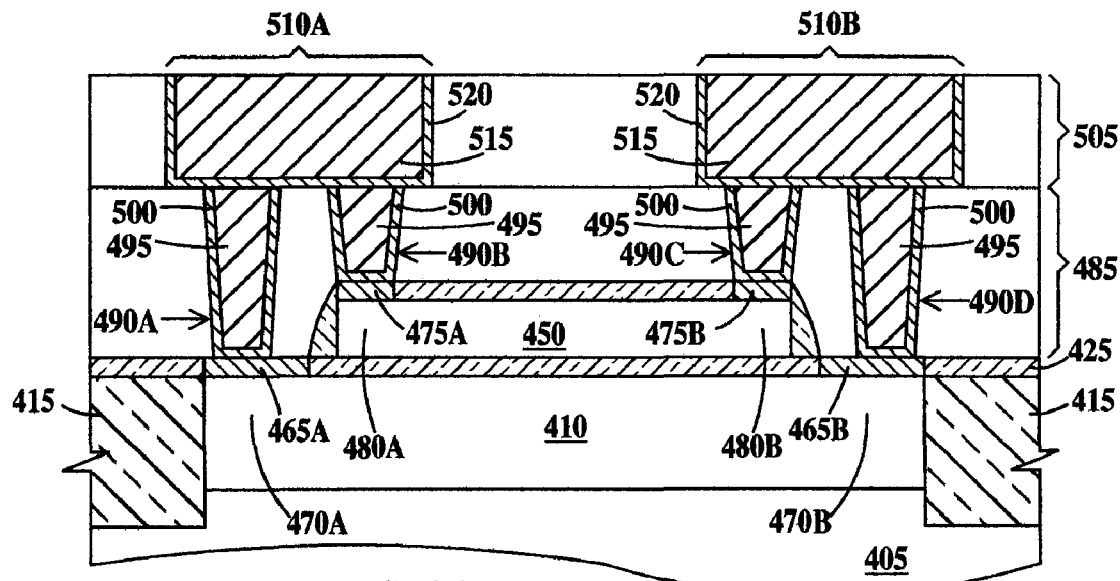

In FIG. 4E, a dielectric layer 485 formed over diffused resistor 410, polysilicon resistor 450 and STI 415. Formed in dielectric layer 485 are contacts 490A, 490B, 490C and 490D. Contacts 490A, 490B, 490C and 490D are formed from a core conductor 495 and an optional conductive liner 500 using a damascene process. An ILD layer 505 is formed over dielectric layer 485. Formed in ILD layer 505 are exemplary damascene wires 510A and 510B. Each damascene wire 510A and 510B is formed from a core conductor 515 and an optional conductive liner 520. Damascene wire 510A is connected to first end 470A of diffused resistor 410 by contact 490A through silicide contact 465A. Damascene wire 510A is also connected to first end 480A of polysilicon resistor 450 by contact 490B through silicide contact 475A. Damascene wire 510B is connected to second end 475B of polysilicon resistor 450 by contact 490C through silicide contact 475B. Damascene wire 510B is also connected to second end 470B of diffused resistor 410 by contact 490D through silicide contact 465B. Thus, diffused resistor 410 and polysilicon resistor 450 are wired in parallel with respect to a voltage source coupled between wires 510A and 510B.

In one example, dielectric layer 485 comprise SiO$_2$, ILD layer 505 comprises SiO$_2$, Si$_3$N$_4$ or combinations thereof, core conductors 490A, 490B, 490C and 490D comprises W, conductive liner 500 comprises Ti, TiN or combinations thereof, core conductor 515 comprises Al, AlCu, AlCuSi or Cu and conductive liner 520 comprises Ti, TiN, Ta, TaN or combinations thereof.

In FIG. 4E, wires 510A and 510B and contacts 490A, 490B, 490C and 490D have different TCRs than resistors 410 and 450. Wires 510A and 510B and contacts 490A, 490B, 490C and 490D have a significantly lower resistance than resistors 410 and 450. In one example the combined resistance of wires 510A and 510B and contacts 490A, 490B, 490C and 490D is about 3 orders of magnitude lower than the combined resistance of resistors 410 and 450.

Figure 4F:
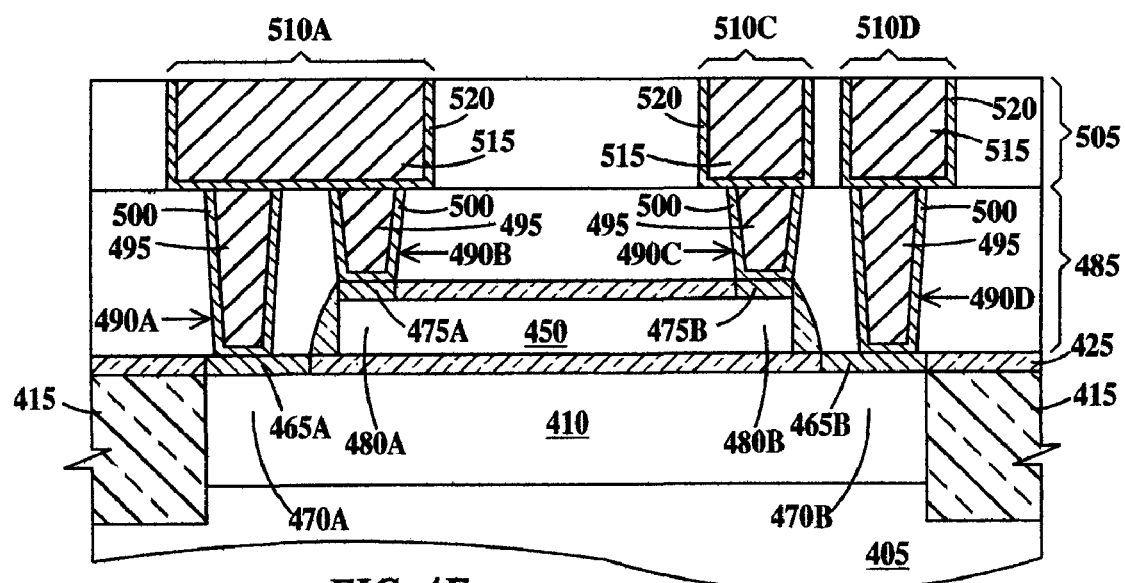

FIG. 4F is similar to FIG. 4E except, damascene wire 510B is replaced with a damascene wire 510C and a damascene wire 510D, both damascene wire 510C and damascene wire 510D formed from core conductor 515 and optional conductive liner 520. Damascene wire 510C is connected to second end 480B of polysilicon resistor 450 by contact 490C through silicide contact 475B. Damascene wire 510D is connected to second end 470B of diffused resistor 410 by contact 490D through silicide contact 465B. Thus, diffused resistor 410 and polysilicon resistor 450 are wired in series with respect to a voltage source coupled between wires 510C and 510D.

In FIG. 4F, wires 510A, 510C and 510D and contacts 490A, 490B, 490C and 490D have different TCRs than resistors 410 and 450. Wires 510A, 510C and 510D and contacts 490A, 490B, 490C and 490D have a significantly lower resistance than resistors 410 and 450. In one example the combined resistance of wires 510A, 510B and 510D and contacts 490A, 490B, 490C and 490D is about 3 orders of magnitude lower than the combined resistance of resistors 410 and 450.

Figure 4G:
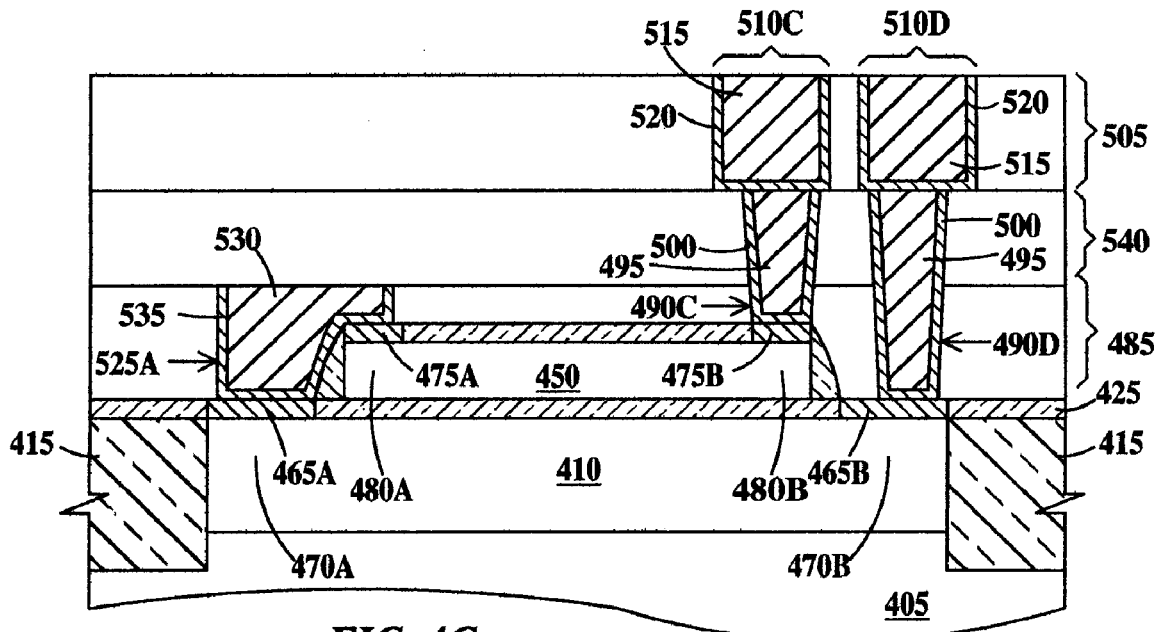

FIG. 4G is similar to FIG. 4F except, damascene wire 510A, contact 490A and contact 490B are re replaced with contact 525A which is formed from a core conductor 530 and an optional conductive liner 535. Contact 525A is formed in dielectric layer 485. Another difference is that contacts 490C and 490D are formed in both dielectric layer 485 and a dielectric layer 540 which itself is formed between dielectric layer 485 and ILD layer 505. The process sequence being: form dielectric 485, form contact 525A in dielectric layer 485, form dielectric layer 540, form contacts 490C and 490D in dielectric layers 540 and 485, form ILD layer 505, and form damascene wires 510C and 510D in ILD layer 505. Contact 525A electrically connects silicide contact 465A of diffused resistor 410 with silicide contact 475A of polysilicon resistor 450. Thus diffused resistor 410 and polysilicon resistor 450 are wired in series with respect to a voltage source coupled between wires 510C and 510D.

In one example, dielectric layer 540 comprises SiO$_2$, core conductor 530 comprises W or polysilicon and conductive liner comprises Ti, TiN or combinations thereof.

In FIG. 4G, wires 510C and 510D and contacts 490C, 490D and 525A have different TCRs than resistors 410 and 450. Wires 510C and 510D and contacts 490C, 490D and 525A have a significantly lower resistance than resistors 410 and 450. In one example the combined resistance of wires 510C and 510D and contacts 490C, 490D and 525A is about 3 orders of magnitude lower than the combined resistance of resistors 410 and 450.

Figure 4H:
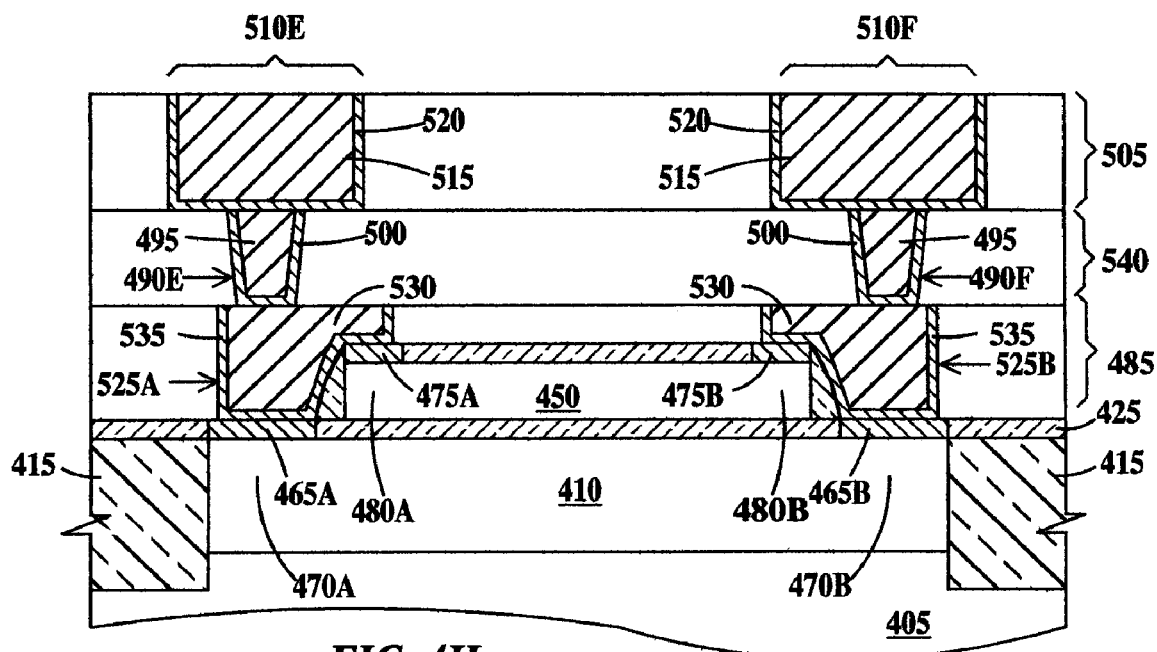

FIG. 4H is similar to FIG. 4G except, damascene wire 510B, contact 490C and contact 490D are re replaced with contact 525B formed from a core conductor 530 and optional conductive liner 535. Contact 525B is formed in dielectric layer 485. Another difference is that contacts 490E and 490F are formed in dielectric layer 540 from core conductor 495 and liner 500 and exemplary damascene wires 510E and 510F are formed in ILD layer 505. Each damascene wire 510E and 510F is formed from core conductor 515 and optional conductive liner 520. Contact 525B electrically connects silicide contact 465B of diffused resistor 410 with silicide contact 475B of polysilicon resistor 450. Thus diffused resistor 410 and polysilicon resistor 450 are wired in parallel with respect to a voltage source coupled between wires 510E and 510F.

In FIG. 4H, wires 510E and 510F and contacts 490E, 490F, 525A and 525B have different TCRs than resistors 410 and 450. Wires 510E and 510F and contacts 490E, 490F, 525A and 525B have a significantly lower resistance than resistors 410 and 450. In one example the combined resistance of wires 510E and 510F and contacts 490E, 490F, 525A and 525B is about 3 orders of magnitude lower than the combined resistance of resistors 410 and 450.

Figure 5A:
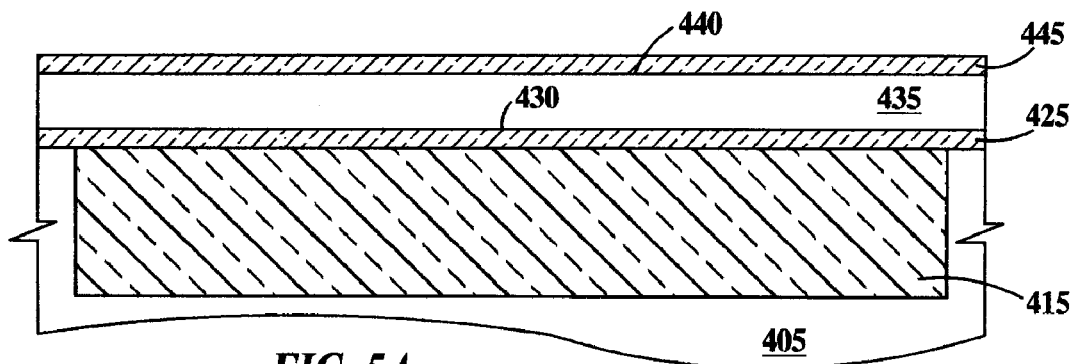
FIGS. 5A through 5J are partial cross-sectional views illustrating fabrication of a tunable TCR resistor according to a fifth embodiment of the present invention.
Figure 5B:
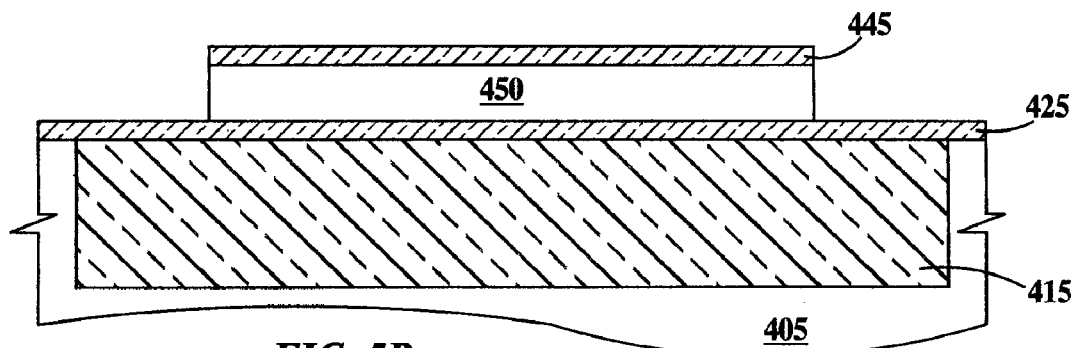
Figure 5C:
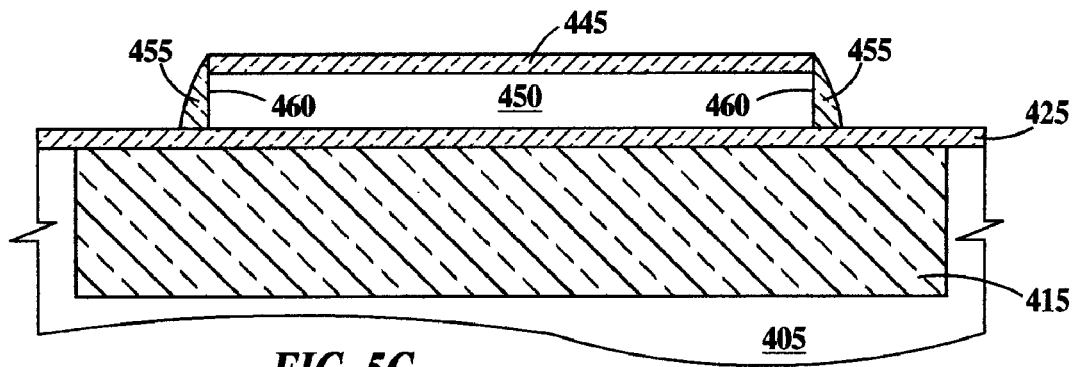

FIGS. 5A through 5J are partial cross-sectional views illustrating fabrication of a tunable TCR resistor according to a fifth embodiment of the present invention. FIGS. 5A, 5B and 5C are similar to FIGS. 4A, 4B and 4C respectively, except dielectric layer 425, polysilicon layer 435 and insulating layer 445 are formed over a larger region of STI 415 in the area where a resistor according to the present invention will be fabricated as described infra, instead of over diffused resistor 410 (see FIG. 4A). Alternatively, STI 415 may not be present, however capacitive coupling between resistor 450 and substrate 405 may occur.

Figure 5D:
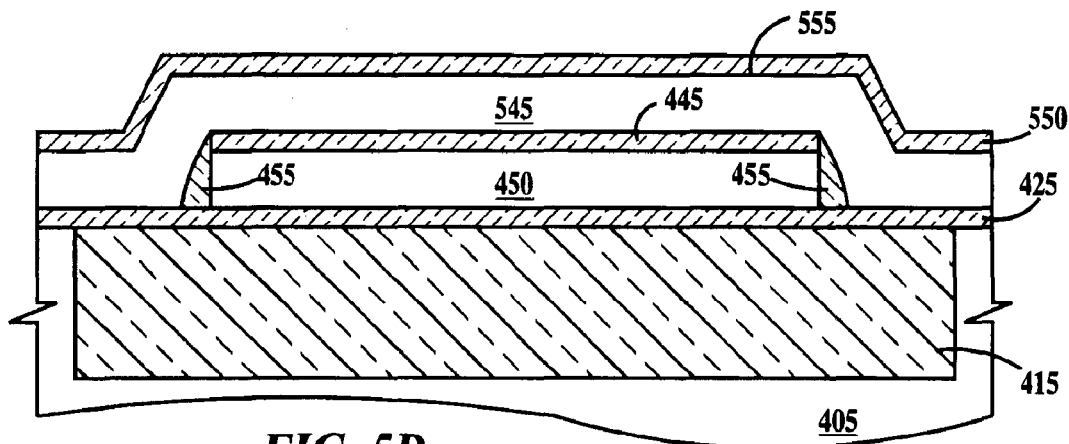

In FIG. 5D, a polysilicon layer 545 is formed over dielectric layer 425, spacers 455 and insulating layer 445. In one example polysilicon layer 545 is the same layer used to form gates of PFETs or NFETs or the base of bipolar SiGe transistors in BiCMOS technology in the integrated circuit incorporating the tunable TCR resistors of the present invent. An insulating layer 550 is formed on a top surface 555 of polysilicon layer 545. In one example insulating layer 550 comprises $SiO_2$, $Si_3N_4$ or combinations thereof.

Figure 5E:
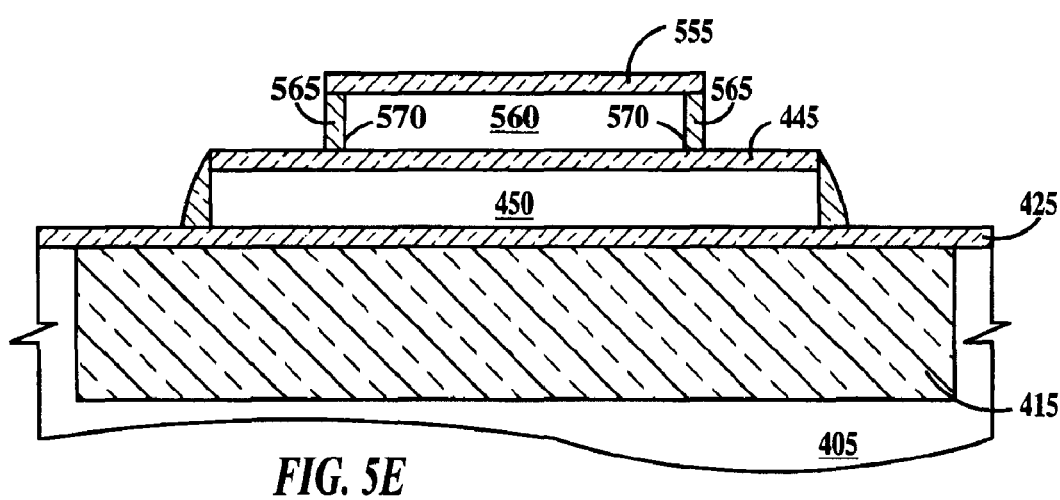

In FIG. 5E, a photolithographic process comprising forming a photoresist layer on insulating layer 550, patterning the photoresist layer, etching insulating layer 550, etching polysilicon layer 545 (see FIG. 5D), and removing the patterned photoresist layer is performed to form a polysilicon resistor 560. Polysilicon resistor 560 has a third TCR. In one example, polysilicon resistor 550 is about 50 to about 400 nm thick. Polysilicon resistor 550 may be chosen to have a TCR in the range of about −4000 ppm/°C. to about 2000 ppm/°C., but not the same TCR as the TCR for polysilicon resistor 450. Material for polysilicon resistor 560 may be selected from, but is not limited to, any of the materials listed in Table III infra. Also in FIG. 5E an optional oxide layer 565 is formed (for example by thermal oxidation of exposed polysilicon) on sidewalls 570 of polysilicon resistor 560.

Figure 5F:
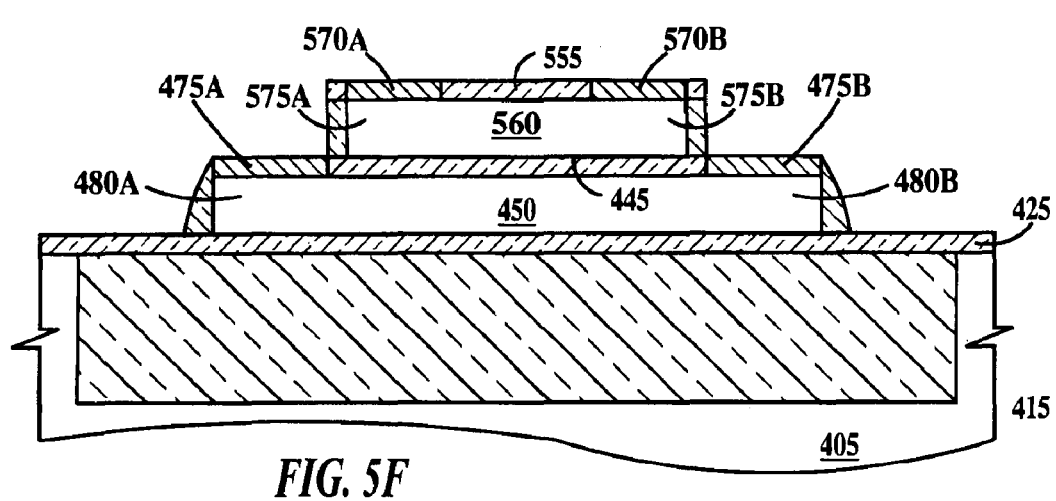

In FIG. 5F, suicide contacts 475A and 475B on respective opposite ends 480A and 480B of polysilicon resistor 450 are formed as described supra. Also suicide contacts 570A and 570B on respective opposite ends 575A and 575B of polysilicon resistor 560 are formed at the same time (and thus of the same material described supra) as silicide contacts 475A and 475B.

FIGS. 5G, 5H, 5I and 5J illustrate alternative methods of interconnecting polysilicon resistor 450 and polysilicon resistor 560.

Figure 5G:
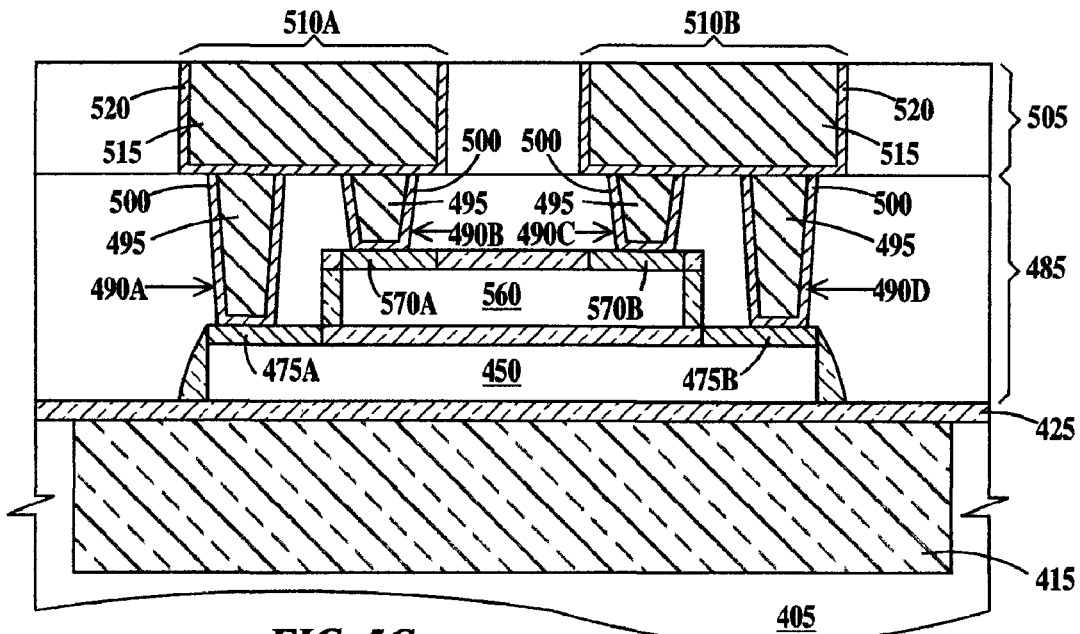

FIG. 5G is similar to FIG. 4E in except for the structures contacted by contacts 490A, 490B, 490C and 490D. In FIG. 5G, dielectric layer 485 formed over polysilicon resistors 450 and 460, and dielectric layer 485 includes contacts 490A, 490B, 490C and 490D. ILD layer 505 is formed over dielectric layer 485. Formed in ILD layer 505 are exemplary damascene wires 510A and 510B. Damascene wire 510A is connected to first polysilicon resistor 450 by contact 490A through silicide contact 475A. Damascene wire 510A is also connected polysilicon resistor 560 by contact 490B through silicide contact 570A. Damascene wire 510B is connected polysilicon resistor 560 by contact 490C through silicide contact 570B. Damascene wire 510B is also connected to polysilicon resistor 450 by contact 490D through silicide contact 475B. Thus, polysilicon resistor 450 and polysilicon resistor 560 are wired in parallel with respect to a voltage source coupled between wires 510A and 510B.

In FIG. 5G, wires 510A and 510B and contacts 490A, 490B, 490C and 490D have different TCRs than resistors 450 and 560. Wires 510A and 510B and contacts 490A, 490B, 490C and 490D have a significantly lower resistance than resistors 450 and 560. In one example the combined resistance of wires 510A and 510B and contacts 490A, 490B, 490C and 490D is about 3 orders of magnitude lower than the combined resistance of resistors 450 and 560.

Figure 5H:
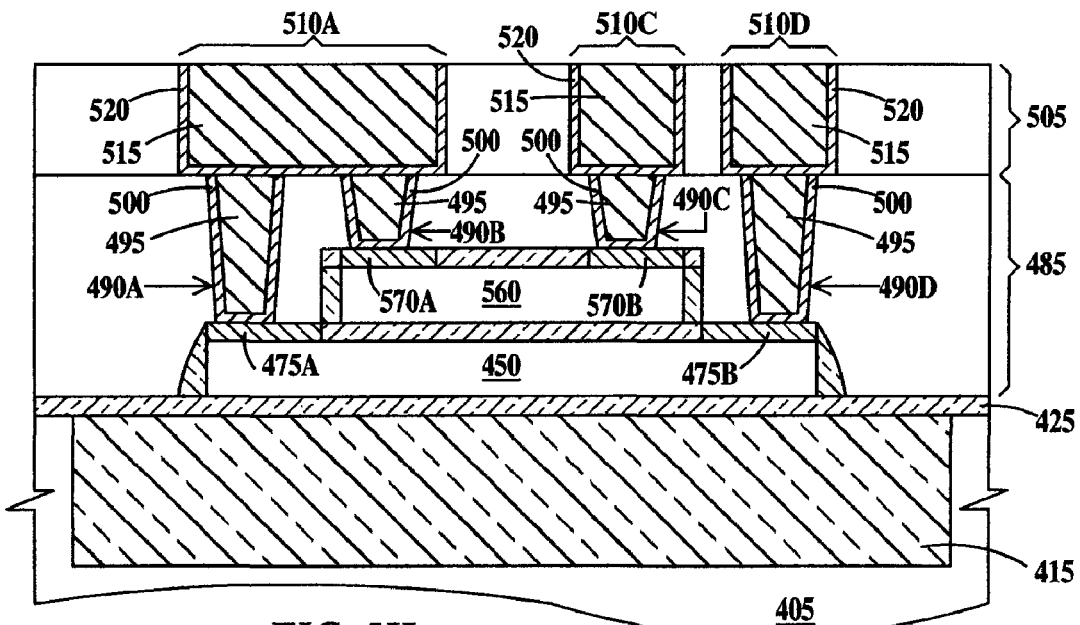

FIG. 5H is similar to FIG. 5G except, damascene wire 510B is replaced with damascene wire 510C and damascene wire 510D. Damascene wire 510C is connected to polysilicon resistor 560 by contact 490C through silicide contact 570B. Damascene wire 510D is connected to polysilicon resistor 450 by contact 490D through silicide contact 475B. Thus, diffused resistor 410 and polysilicon resistor 450 are wired in series with respect to a voltage source coupled between wires 510C and 510D.

In FIG. 5H, wires 510A, 510C and 510D and contacts 490A, 490B, 490C and 490D have different TCRs than resistors 450 and 560. Wires 510A, 510C and 510D and contacts 490A, 490B, 490C and 490D have a significantly lower resistance than resistors 450 and 560. In one example the combined resistance of wires 510A, 510C and 510D and contacts 490A, 490B, 490C and 490D is about 3 orders of magnitude lower than the combined resistance of resistors 450 and 560.

Figure 5I:
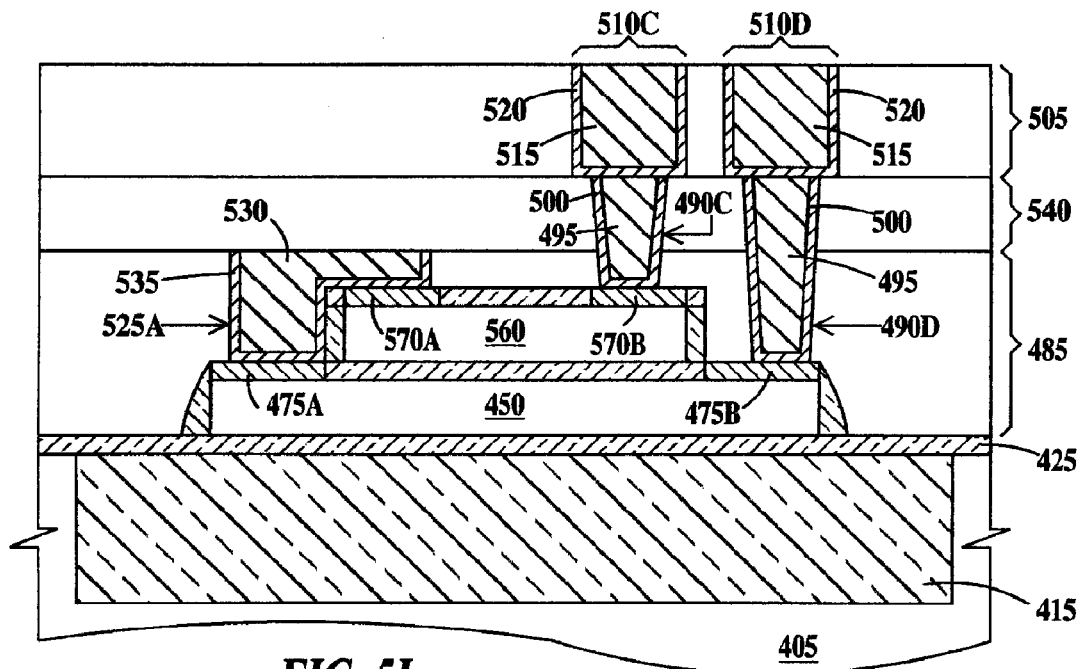

FIG. 5I is similar to FIG. 5H except, damascene wire 510A, contact 490A and contact 490B are replaced with contact 525A. Contact 525A is formed in dielectric layer 485. Another difference is that contacts 490C and 490D are formed in both dielectric layer 485 and a dielectric layer 540 between dielectric layer 485 and ILD layer 505. Contact 525A electrically connects silicide contact 475A of polysilicon resistor 450 with silicide contact 570A of polysilicon resistor 560. Thus polysilicon resistor 450 and polysilicon resistor 560 are wired in series with respect to a voltage source coupled between wires 510C and 510D.

In FIG. 5I, wires 510C and 510D and contacts 490C, 490D and 525A have different TCRs than resistors 450 and 560. Wires 510C and 510D and contacts 490C, 490D and 525A have a significantly lower resistance than resistors 450 and 560. In one example the combined resistance of wires 510C and 510D and contacts 490C, 490D and 525A is about 3 orders of magnitude lower than the combined resistance of resistors 450 and 560.

Figure 5J:
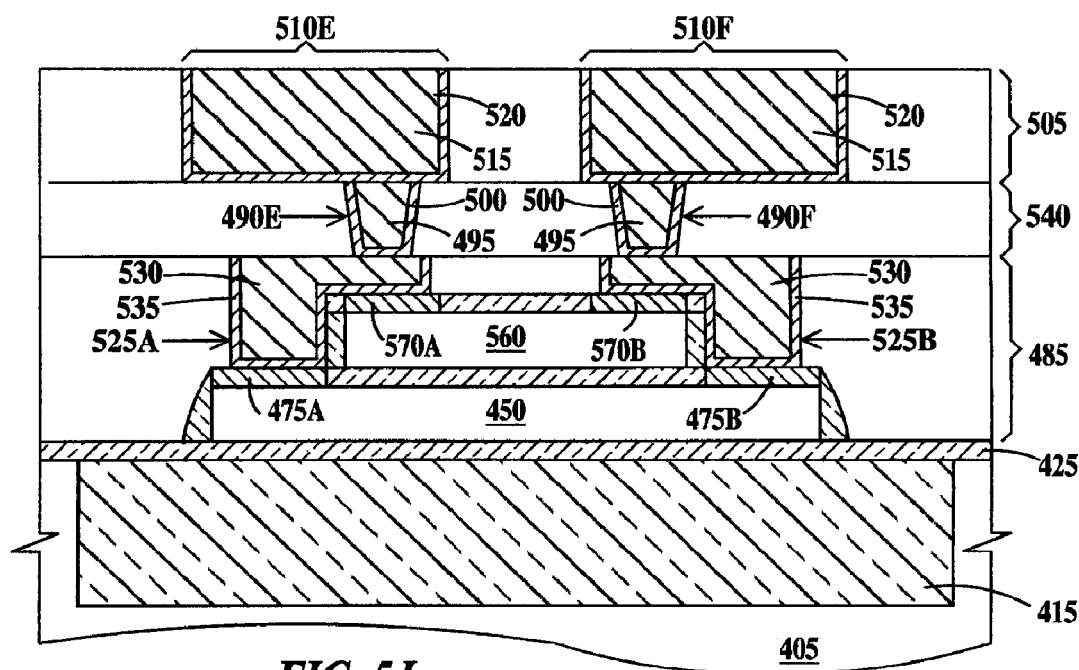

FIG. 5J is similar to FIG. 5I except, damascene wire 510B, contact 490C and contact 490D are re replaced with contact 525B. Contact 525B is formed in dielectric layer 485. Another difference is that contacts 490E and 490F are formed in dielectric layer 540 and exemplary damascene wires 510E and 510F are formed in ILD layer 505. Contact 525B electrically connects silicide contact 475B of polysilicon resistor 450 with silicide contact 570B of polysilicon resistor 560. Thus polysilicon resistor 450 and polysilicon resistor 560 are wired in parallel with respect to a voltage source coupled between wires 510E and 510F.

In FIG. 5I, wires 510E and 510F and contacts 525A and 525B have different TCRs than resistors 450 and 560. Wires 510E and 510F and contacts 525A and 525B have a significantly lower resistance than resistors 450 and 560. In one example the combined resistance of wires 510E and 510F and contacts 525A and 525B is about 3 orders of magnitude lower than the combined resistance of resistors 450 and 560.

Figure 6:
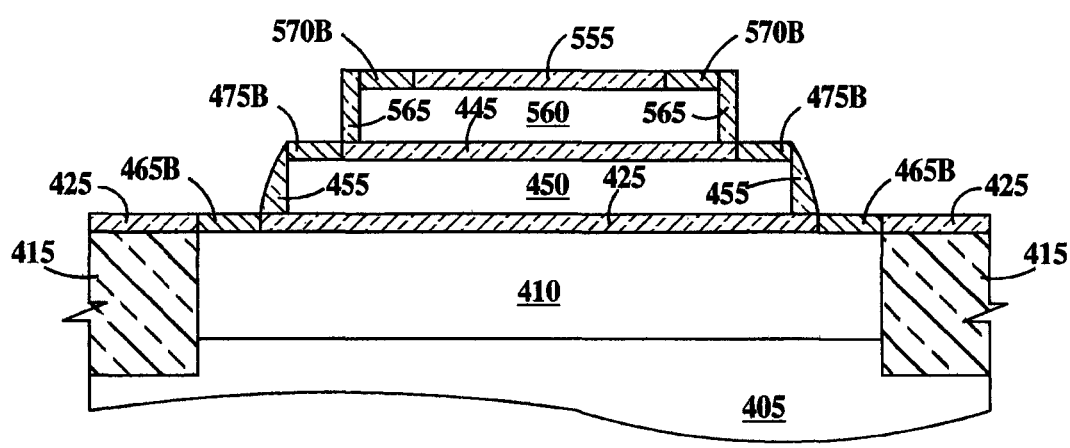
FIG. 6 is a partial cross-sectional view illustrating a tunable TCR resistor according to a sixth embodiment of the present invention.

The sixth embodiment of the present invention combines the fourth and fifth embodiments of the present invention. FIG. 6 is a partial cross-sectional view illustrating a tunable TCR resistor according to a sixth embodiment of the present invention. In FIG. 6, polysilicon resistor 560 is formed over and separated from polysilicon resistor 450 by insulating layer 445 and polysilicon resistor 450 is formed over and separated from diffused resistor 410 by dielectric layer 425. Fabrication of diffused resistor 410, polysilicon resistor 450 and polysilicon resistor 560 have been described supra. There are many ways diffused resistor 410, polysilicon resistor 450 and polysilicon resistor 560 may be wired in combination (through silicide contacts 465A, 465B, 475A, 475B, 570A and 570B) using any of the wiring techniques taught supra or other wiring techniques known in the art. In the third embodiment of the present invention, at least two of diffused resistor 410, polysilicon resistor 450 and polysilicon resistor 560 have different TCRs.

Thus, the present invention provides an integrated circuit resistor and a method of fabricating the resistor wherein the temperature to dependency of resistance of the resistor can be tuned during design and/or fabrication of the integrated circuit containing the resistor.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure comprising:
    a first resistor comprising a first metal, conductive metal oxide or metal silicide first material, said first material having a first temperature coefficient of resistance, said first resistor in a first interlevel dielectric layer of an integrated circuit having at least two interlevel dielectric layers, each interlevel dielectric layer containing metal wires;
    a second resistor comprising a second metal, conductive metal oxide or metal silicide second material, said second material having a second temperature coefficient of resistance, said second temperature coefficient of resistance different from said first temperature coefficient of resistance, said second resistor in said first interlevel dielectric layer of said integrated circuit or in a second interlevel dielectric layer of said integrated circuit, said first resistor and said second resistor electrically connected to each other and electrically coupled to a voltage source by wires formed in said first or said first and second dielectric layers, said wires having a lower resistance than either of said first and second resistors; and
    wherein when said first resistor and said second resistor are both in said first interlevel dielectric layer, a bottom surface of said second resistor is in direct physical and electrical contact with a top surface of said first resistor.

2. The structure of claim 1, wherein, when said second resistor is in said second interlevel dielectric level, said first and second resistors are electrically connected in series with each other with respect to said voltage source.

3. The structure of claim 1, wherein, when said second resistor is in said second interlevel dielectric level, said first and second resistors are electrically connected in parallel each other with respect to said voltage source.

4. The structure of claim 1, wherein at least one edge of said first resistor extends past a corresponding edge of said second resistor, a bottom surface of said second resistor is separated from a top surface of said first resistor by an intervening insulating layer and said first and second resistors electrically coupled in series with respect to said voltage source.

5. The structure of claim 1, wherein said first temperature coefficient of resistance and said second temperature coefficient of resistance have opposite polarities.

6. The structure of claim 1, wherein said first temperature coefficient of resistance and said second temperature coefficient of resistance have the same polarity and different magnitudes.

7. The structure of claim 1, wherein said first temperature coefficient of resistance and said second temperature coefficient of resistance have the opposite polarities and about the same magnitude.

8. The structure of claim 1, wherein said first material and said second material are mutually exclusively selected from the group consisting of CrNi, CrSi, CrTi, CrSnO, $SnO_2$, W, Mo, Re, Ta, $Ta_2N$, NiCr, NiCrAlCu and Ru.

9. The structure of claim 1, wherein said metal wires are damascene or dual damascene wires.

10. The structure of claim 1, further including a third interlevel dielectric layer containing wires interposed between said first interlevel dielectric layer and a substrate of said integrated circuit.

11. A structure comprising:
    a first resistor comprising a first metal, conductive metal oxide or metal silicide first material, said first material having a first temperature coefficient of resistance, said first resistor in a first interlevel dielectric layer of an integrated circuit having at least two interlevel dielectric layers, each interlevel dielectric layer containing metal wires;
    a second resistor comprising a second metal, conductive metal oxide or metal silicide second material, said second material having a second temperature coefficient of resistance, said second temperature coefficient of resistance different from said first temperature coefficient of resistance, said second resistor in said first interlevel dielectric layer of said integrated circuit or in a second interlevel dielectric layer of said integrated circuit, said first resistor and said second resistor electrically connected to each other and electrically coupled to a voltage source by wires formed in said first or said first and second dielectric layers, said wires having a lower resistance than either of said first and second resistors; and
    wherein when said first resistor and said second resistor are both in said first interlevel dielectric layer, at least one edge of said first resistor extends past a corresponding edge of said second resistor, a bottom surface of said second resistor is separated from a top surface of said first resistor by an intervening insulating layer and said first and second resistors electrically coupled in parallel with respect to said voltage source.

12. The structure of claim 11, wherein, when said second resistor is in said second interlevel dielectric level, said first and second resistors are electrically connected in series with each other with respect to said voltage source.

13. The structure of claim 11, wherein, when said second resistor is in said second interlevel dielectric level, said first and second resistors are electrically connected in parallel each other with respect to said voltage source.

14. The structure of claim 11, wherein at least one edge of said first resistor extends past a corresponding edge of said second resistor, a bottom surface of said second resistor is separated from a top surface of said first resistor by an intervening insulating layer and said first and second resistors electrically coupled in series with respect to said voltage source.

15. The structure of claim 11, wherein said first temperature coefficient of resistance and said second temperature coefficient of resistance have opposite polarities.

16. The structure of claim 11, wherein said first temperature coefficient of resistance and said second temperature coefficient of resistance have the same polarity and different magnitudes.

17. The structure of claim 11, wherein said first temperature coefficient of resistance and said second temperature coefficient of resistance have the opposite polarities and about the same magnitude.

18. The structure of claim 11, wherein said first material and said second material are mutually exclusively selected from the group consisting of CrNi, CrSi, CrTi, CrSnO, $SnO_2$, W, Mo, Re, Ta, $Ta_2N$, NiCr, NiCrAlCu and Ru.

19. A structure, comprising:
an integrated circuit having at least two interlevel dielectric layers each interlevel dielectric layer containing metal wires;
a first resistor in said integrated circuit, said first resistor comprising a first silicon material, said first material having a first temperature coefficient of resistance;
a second resistor in said integrated circuit, said second resistor comprising a second silicon material, said second material having a second temperature coefficient of resistance, said second temperature coefficient of resistance different than said first temperature coefficient of resistance, said first resistor and said second resistor electrically connected to each other and electrically coupled in series or in parallel with respect to a voltage source
a third resistor comprising a third silicon material, said third resistor on a top surface of an additional dielectric layer, said additional dielectric layer on a top surface of said second resistor, said third resistor is a polysilicon resistor comprising doped polysilicon;
wherein said first resistor is a diffused resistor in a doped region of a single-crystal silicon substrate of said integrated circuit and said first silicon material is doped single-crystal silicon; and
wherein said second resistor is a polysilicon resistor on a top surface of an interlevel dielectric layer of said integrated circuit, said interlevel dielectric layer on a top surface of said doped silicon region and said second silicon material is doped polysilicon.

20. The structure of claim 19, wherein said first silicon material, said second silicon material and said third silicon material are not the same materials and are independently doped with As, P, B, $BF_2$, In, Sb or combinations thereof.

21. The structure of claim 19, wherein:
said first resistor is a polysilicon resistor on a top surface of a dielectric region of said substrate and said first material is a first doped polysilicon; and
said second resistor is a polysilicon resistor on a top surface of a dielectric layer, said dielectric layer on a top surface of said first resistor and said second material is a second doped polysilicon.

22. The structure of claim 21, wherein said first silicon material and said second silicon material are not the same material and are independently doped with As, P, B, $BF_2$, In, Sb or combinations thereof.

23. The structure of claim 19, wherein said first temperature coefficient of resistance and said second temperature coefficient of resistance have opposite polarities.

24. The structure of claim 19, wherein said first temperature coefficient of resistance and said second temperature coefficient of resistance have the same polarity and different magnitudes.

25. The structure of claim 19, wherein said first temperature coefficient of resistance and said second temperature coefficient of resistance have the different polarities and about the same magnitude.

26. The structure of claim 19, wherein said first silicon material and said second silicon material are not the same material and are independently doped with As, P, B, $BF_2$, In, Sb or combinations thereof.

27. The structure of claim 19, wherein said metal wires are damascene or dual damascene wires.

28. The structure of claim 19, wherein a bottom surface of said second resistor is located directly over a top surface of said first resistor.

* * * * *